(12) United States Patent
Ikeda et al.

(10) Patent No.: US 11,848,697 B2
(45) Date of Patent: Dec. 19, 2023

(54) COMMUNICATION DEVICE AND ELECTRONIC DEVICE

(71) Applicant: SEMICONDUCTOR ENERGY LABORATORY CO., LTD., Atsugi (JP)

(72) Inventors: Takayuki Ikeda, Kanagawa (JP); Hitoshi Kunitake, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 32 days.

(21) Appl. No.: 17/616,539

(22) PCT Filed: Jun. 3, 2020

(86) PCT No.: PCT/IB2020/055211
§ 371 (c)(1),
(2) Date: Dec. 3, 2021

(87) PCT Pub. No.: WO2020/245728
PCT Pub. Date: Dec. 10, 2020

(65) Prior Publication Data
US 2022/0255579 A1 Aug. 11, 2022

(30) Foreign Application Priority Data
Jun. 7, 2019 (JP) ................. 2019-107075

(51) Int. Cl.
*H03K 17/16* (2006.01)
*H03K 17/693* (2006.01)
*H04B 1/44* (2006.01)

(52) U.S. Cl.
CPC ............. *H04B 1/44* (2013.01); *H03K 17/16* (2013.01); *H03K 17/693* (2013.01)

(58) Field of Classification Search
CPC .... H03K 17/693; H03K 17/16; H03K 17/161; H04B 1/44
See application file for complete search history.

(56) References Cited

U.S. PATENT DOCUMENTS 5,774,792 A 6/1998 Tanaka et al.
8,224,277 B2 7/2012 Furutani
(Continued)

FOREIGN PATENT DOCUMENTS

CN 101794793 A 8/2010
CN 104143569 A 11/2014
(Continued)

OTHER PUBLICATIONS

Yamazaki et al.( "Properties of crystalline In—Ga—Zn-oxide semiconductor and its transistor characteristics", Jpn. J. Appl. Phys. Japanese Journal of Applied Physics , Mar. 31, 2014, vol. 53, No. 4S, pp. 04ED18-1-04ED18-10) (Year: 2014).*
(Continued)

*Primary Examiner* — Patrick C Chen
(74) *Attorney, Agent, or Firm* — Fish & Richardson P.C.

(57) ABSTRACT

A communication device capable of transmitting and receiving high-potential signals is provided. The communication device includes a duplexer including first to fourth transistors, a transmission terminal, a reception terminal, an antenna terminal, and first and second control terminals. The transmission terminal is electrically connected to one of a source and a drain of each of the first and second transistors. The reception terminal is electrically connected to one of a source and a drain of each of the third and fourth transistors. The antenna terminal is electrically connected to the other of the source and the drain of each of the second and fourth transistors. The first control terminal is electrically connected to gates of the second and third transistors. The second control terminal is electrically connected to gates of (Continued)

the first and fourth transistors. A semiconductor of each of the first to fourth transistors contains a metal oxide.

6 Claims, 17 Drawing Sheets

(56) References Cited

U.S. PATENT DOCUMENTS

| | | |
|---|---|---|
| 8,244,199 B2 | 8/2012 | Goto et al. |
| 8,385,876 B2 | 2/2013 | Goto et al. |
| 9,246,483 B2 | 1/2016 | Bakalski et al. |
| 9,264,998 B2 | 2/2016 | Takeuchi et al. |
| 9,496,340 B2 | 11/2016 | Takeuchi et al. |
| 9,570,974 B2 | 2/2017 | Bakalski et al. |
| 10,032,714 B2 | 7/2018 | Ishimaru |
| 2009/0195232 A1 | 8/2009 | Koudymov et al. |
| 2010/0079203 A1 | 4/2010 | Furutani |
| 2010/0188163 A1 | 7/2010 | Goto et al. |
| 2011/0199146 A1* | 8/2011 | Bakalski .......... H03K 17/6871 327/427 |
| 2012/0292703 A1* | 11/2012 | Goto ................ H01L 27/088 257/E27.112 |
| 2014/0335800 A1 | 11/2014 | Takeuchi et al. |
| 2015/0129965 A1* | 5/2015 | Roy ............... H01L 29/41758 257/347 |
| 2016/0241140 A1 | 8/2016 | Bakalski et al. |
| 2017/0005651 A1 | 1/2017 | Ishimaru |

FOREIGN PATENT DOCUMENTS

| | | |
|---|---|---|
| DE | 102011003880 | 8/2011 |
| JP | 05-129979 A | 5/1993 |
| JP | 08-070245 A | 3/1996 |
| JP | 2010-102701 A | 5/2010 |
| JP | 2010-178026 A | 8/2010 |
| JP | 2011-193449 A | 9/2011 |
| JP | 2012-090312 A | 5/2012 |
| JP | 2014-239201 A | 12/2014 |
| JP | 2017-017258 A | 1/2017 |

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

International Search Report (Application No. PCT/IB2020/055211) dated Sep. 1, 2020.

Written Opinion (Application No. PCT/IB2020/055211) dated Sep. 1, 2020.

* cited by examiner

FIG. 11A
Intermediate state
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 11B
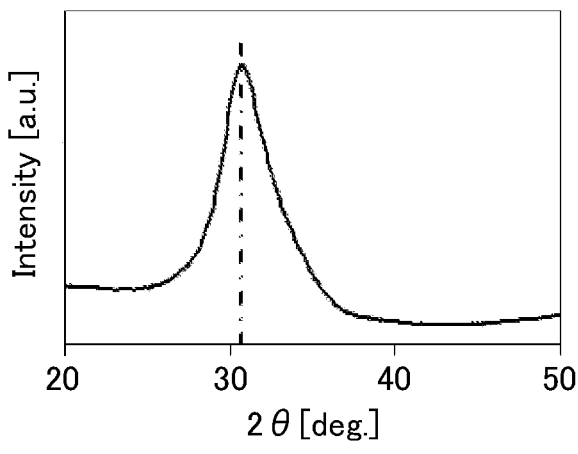
FIG. 11C
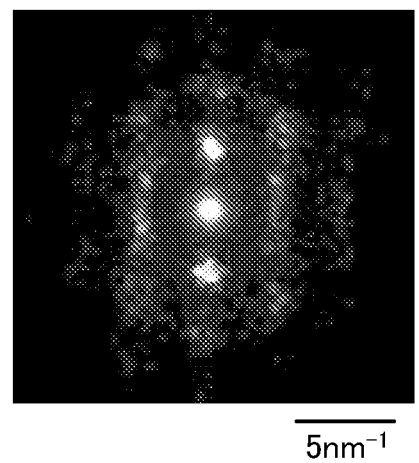

COMMUNICATION DEVICE AND ELECTRONIC DEVICE

CROSS REFERENCE TO RELATED APPLICATIONS

This application is a U.S. National Phase Application under 35 U.S.C. § 371 of International Application PCT/IB2020/055211, filed on Jun. 3, 2020, which is incorporated by reference and claims the benefit of a foreign priority application filed in Japan on Jun. 7, 2019, as Application No. 2019-107075.

TECHNICAL FIELD

One embodiment of the present invention relates to a communication device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

Information terminals that are easy to carry, typified by smartphones, tablet terminals, and the like, have come into widespread use. With the widespread use of information terminals, various communication standards have been established. For example, the use of the LTE-Advanced standard called the fourth-generation mobile communication system (4G) has started.

With the development of information technology such as IoT (Internet of Things), the amount of data handled in information terminals has been recently showing an increasing tendency. In addition, the transmission speed of electronic devices such as information terminals needs to be increased.

In order to be compatible with various kinds of information technology such as IoT, a new communication standard called the fifth-generation mobile communication system (5G) that achieves higher transmission speed, more simultaneous connections, and shorter delay time than 4G has been examined. The 5G uses communication frequencies of the 3.7 GHz band, the 4.5 GHz band, and the 28 GHz band.

A 5G compatible communication device is manufactured using a semiconductor containing one kind of element, such as Si, as its main component or a compound semiconductor containing a plurality of kinds of elements, such as Ga and As, as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2). Non-Patent Document 1 and Non-Patent Document 2 each disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

When the communication frequency increases, attenuation of radio waves increases; hence, the distance that a signal transmitted through the radio waves reaches becomes shorter. Thus, in the case where the communication frequency is high, the amplitude of the potential of the signal is preferably increased.

One object of one embodiment of the present invention is to provide a communication device capable of transmitting and receiving high-potential signals. Another object is to provide a communication device capable of being used in a high-frequency band. Another object is to provide a communication device capable of transmitting and receiving signals accurately. Another object is to provide a small communication device. Another object is to provide a highly reliable communication device. Another object is to provide a novel communication device.

Note that the description of these objects does not preclude the existence of other objects. One embodiment of the present invention does not have to achieve all these objects. Other objects will be apparent from and can be derived from the description of the specification, the drawings, the claims, and the like.

Means for Solving the Problems

One embodiment of the present invention is a communication device including a first transistor, a second transistor, a third transistor, a fourth transistor, a transmission terminal, a reception terminal, an antenna terminal, a first control terminal, and a second control terminal. The transmission terminal is electrically connected to one of a source and a drain of the first transistor and one of a source and a drain of the second transistor. The reception terminal is electrically connected to one of a source and a drain of the third transistor and one of a source and a drain of the fourth transistor. The antenna terminal is electrically connected to the other of the source and the drain of the second transistor and the other of the source and the drain of the fourth transistor. The first control terminal is electrically connected to a gate of the second transistor and a gate of the third transistor. The second control terminal is electrically connected to a gate of the first transistor and a gate of the fourth transistor. A semiconductor of each of the first to fourth transistors contains a metal oxide.

In the above embodiment, a potential of the other of the source and the drain of each of the first and third transistors may be a reference potential. Each of the first to fourth transistors may serve as a switch. To turn on the second and third transistors, potentials of the gates of the second and third transistors may be set to a first potential. To turn off the second and third transistors, the potentials of the gates of the second and third transistors may be set to a second potential. A difference between the first potential and the reference potential may be more than or equal to 2 V. The second potential may be lower than the reference potential.

In the above embodiment, to transmit a first signal from the transmission terminal to the antenna terminal, the potentials of the gates of the second and third transistors may be set to the first potential, and potentials of the gates of the first and fourth transistors may be set to the second potential. To transmit a second signal from the antenna terminal to the reception terminal, the potentials of the gates of the second and third transistors may be set to the second potential, and the potentials of the gates of the first and fourth transistors may be set to the first potential.

In the above embodiment, the second potential may be a negative potential.

Another embodiment of the present invention is a communication device including a substrate, a first insulator, a second insulator, a first conductor, a second conductor, a third conductor, a fourth conductor, a fifth conductor, a sixth conductor, a seventh conductor, an eighth conductor, a ninth conductor, a tenth conductor, a first semiconductor, a second semiconductor, a third semiconductor, a fourth semiconductor, a transmission terminal, an antenna terminal, a reception terminal, a first control terminal, and a second control terminal. The first insulator is provided over the substrate. The first conductor is provided over the first insulator. The second insulator is provided over the first conductor. A first transistor in which the second conductor serves as one of a source and a drain, the third conductor serves as the other of the source and the drain, the fourth conductor serves as a gate, and a channel formation region is formed in the first semiconductor; a second transistor in which the third conductor serves as one of a source and a drain, the fifth conductor serves as the other of the source and the drain, the sixth conductor serves as a gate, and a channel formation region is formed in the second semiconductor; a third transistor in which the fifth conductor serves as one of a source and a drain, the seventh conductor serves as the other of the source and the drain, the eighth conductor serves as a gate, and a channel formation region is formed in the third semiconductor; and a fourth transistor in which the seventh conductor serves as one of a source and a drain, the ninth conductor serves as the other of the source and the drain, the tenth conductor serves as a gate, and a channel formation region is formed in the fourth semiconductor are provided over the second insulator. The first conductor includes regions overlapped by the third conductor, the fifth conductor, and the seventh conductor. Each of the first to fourth semiconductors contains a metal oxide. The transmission terminal is electrically connected to the third conductor. The antenna terminal is electrically connected to the fifth conductor. The reception terminal is electrically connected to the seventh conductor. The first control terminal is electrically connected to the fourth conductor and the eighth conductor. The second control terminal is electrically connected to the sixth conductor and the tenth conductor.

In the above embodiment, potentials of the second and ninth conductors may be a reference potential. Each of the first to fourth transistors may serve as a switch. To turn on the first and third transistors, potentials of the fourth and eighth conductors may be set to a first potential. To turn off the first and third transistors, the potentials of the fourth and eighth conductors may be set to a second potential. A difference between the first potential and the reference potential may be more than or equal to 2 V. The second potential may be lower than the reference potential.

In the above embodiment, to transmit a first signal from the transmission terminal to the antenna terminal, the fourth and eighth conductors may be set to the second potential, and the sixth and tenth conductors may be set to the first potential. To transmit a second signal from the antenna terminal to the reception terminal, the fourth and eighth conductors may be set to the first potential, and the sixth and tenth conductors may be set to the second potential.

In the above embodiment, the second potential may be a negative potential.

In the above embodiment, a potential of the first conductor may be the reference potential.

In the above embodiment, the metal oxide may contain at least one of In and Zn.

Another embodiment of the present invention is an electronic device including the communication device of one embodiment of the present invention and a speaker, a microphone, or a secondary battery.

Effect of the Invention

According to one embodiment of the present invention, a communication device capable of transmitting and receiving high-potential signals can be provided. A communication device capable of being used in a high-frequency band can be provided. A communication device capable of transmitting and receiving signals accurately can be provided. A small communication device can be provided. A highly reliable communication device can be provided. A novel communication device can be provided.

Note that the description of these effects does not preclude the existence of other effects. One embodiment of the present invention does not have to have all these effects. Note that other effects will be apparent from and can be derived from the description of the specification, the drawings, the claims, and the like.

BRIEF DESCRIPTION OF THE DRAWINGS

FIG. 4A, FIG. 4B1, and FIG. 4B2 are circuit diagrams each illustrating an example of a method for operating a communication device.

FIG. 7B1 to FIG. 7B4 are circuit diagrams illustrating structure examples of a communication device.

FIG. 11A is a diagram showing the classification of crystal structures of IGZO. FIG. 11B is a diagram showing an XRD spectrum of a CAAC-IGZO film. FIG. 11C is an image showing a nanobeam electron diffraction pattern of a CAAC-IGZO film.

MODE FOR CARRYING OUT THE INVENTION

Figure 1A:
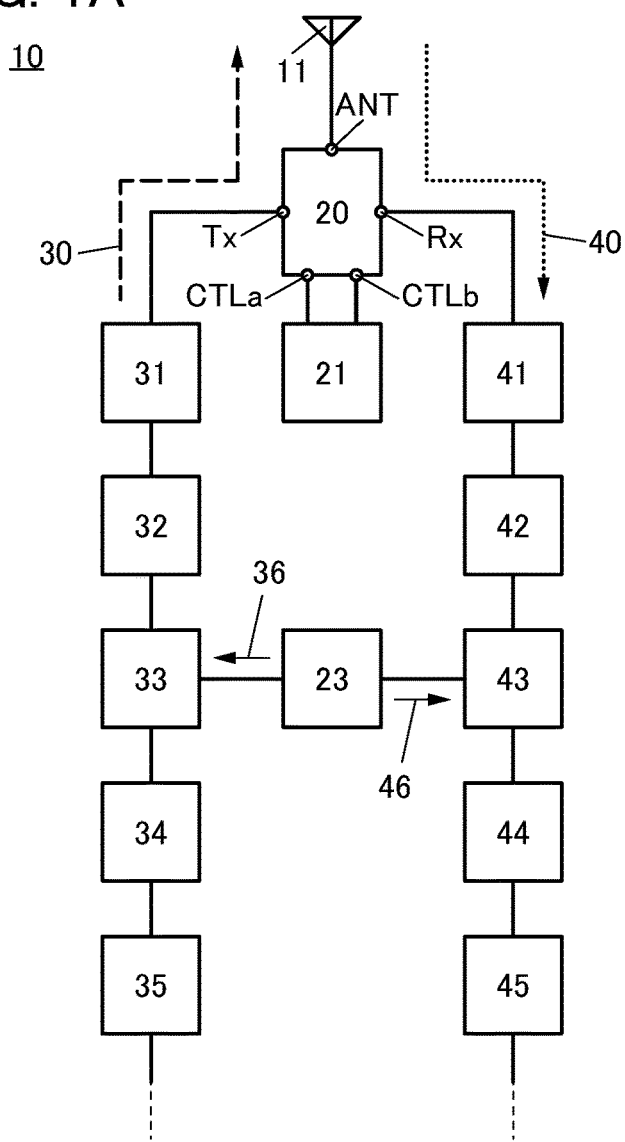
FIG. 1A is a block diagram illustrating a structure example of a communication device.

Embodiments will be described in detail with reference to the drawings. Note that the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, and the like disclosed in the drawings and the like. For example, in an actual manufacturing process, a resist mask or the like might be unintentionally reduced in size by treatment such as etching, which might not be reflected in the drawings for easy understanding.

In a top view (also referred to as a plan view), a perspective view, and the like, some components might be omitted for easy understanding of the drawings.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current, inputs or outputs voltage, or receives or transmits a signal. Accordingly, part of a wiring or an electrode functions as a terminal in some cases.

Note that the term "over" or "under" in this specification and the like does not necessarily mean that a component is placed directly on and in contact with or directly under and in contact with another component. For example, the expression "electrode B over insulator A" does not necessarily mean that the electrode B is formed on and in direct contact with the insulator A, and does not exclude the case where another component is provided between the insulator A and the electrode B.

Functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Radio waves, for example, can be transmitted without connection through a wiring. For example, in the case where radio waves generated by an AC power source are transmitted to an antenna, the AC power source and the antenna are not necessarily connected physically to each other by a wiring or the like. Even in this case, the AC power supply and the antenna can be regarded as being electrically connected to each other. That is, components that are not physically connected to each other can sometimes be regarded as being electrically connected to each other.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

A voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order, such as the order of steps or the stacking order. A term without an ordinal number in this specification may be provided with an ordinal number in the scope of claims in order to avoid confusion among components. A term with an ordinal number in this specification may be provided with a different ordinal number in the scope of claims. Even when a term is provided with an ordinal number in this specification and the like, the ordinal number might be omitted in the scope of claims.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a gate refers to part or all of a gate electrode and a gate wiring. A gate wiring refers to a wiring for electrically connecting at least one gate electrode of a transistor to another electrode or another wiring.

In this specification and the like, a source refers to part or all of a source region, a source electrode, and a source wiring. A source region refers to a region in a semiconductor, where the resistivity is lower than or equal to a given value. A source electrode refers to part of a conductor that is connected to a source region. A source wiring refers to a wiring for electrically connecting at least one source electrode of a transistor to another electrode or another wiring.

In this specification and the like, a drain refers to part or all of a drain region, a drain electrode, and a drain wiring. A drain region refers to a region in a semiconductor, where the resistivity is lower than or equal to a given value. A drain electrode refers to part of a conductor that is connected to a drain region. A drain wiring refers to a wiring for electrically connecting at least one drain electrode of a transistor to another electrode or another wiring.

Embodiment 1

A communication device of one embodiment of the present invention will be described with reference to drawings. FIG. 1A is a block diagram illustrating a structure example of a wireless transceiver 10 that is a type of communication device.

Note that the structure of a communication device described in this specification and the like is just an example, and a communication device does not necessarily include all the components. A communication device only needs to include necessary components among the components described in this specification and the like. A communication device may include a component other than the components described in this specification and the like.

The wireless transceiver 10 includes an antenna 11, a duplexer 20, a control circuit 21, a local oscillator 23, a power amplifier 31, a band-pass filter 32, a mixer 33, a band-pass filter 34, a modulator 35, a low-noise amplifier 41, a band-pass filter 42, a mixer 43, a band-pass filter 44, and a demodulator 45.

The duplexer 20 includes an antenna terminal ANT, a transmission terminal Tx, a reception terminal Rx, a control terminal CTLa, and a control terminal CTLb. The antenna terminal ANT is electrically connected to the antenna 11. The transmission terminal Tx is electrically connected to the power amplifier 31. The reception terminal Rx is electrically connected to the low-noise amplifier 41. The control terminal CTLa and the control terminal CTLb are electrically connected to the control circuit 21. Note that the control terminal CTLa and the control terminal CTLb may be electrically connected to different control circuits.

The duplexer 20 has a function of achieving transmission and reception of radio signals with one antenna. The control circuit 21 has a function of controlling the operation of the duplexer 20. Specifically, the control circuit 21 has a function of generating potentials supplied to the control terminal CTLa and the control terminal CTLb.

The modulator 35 has a function of generating an elementary signal for transmitting a control signal, a data signal, and the like from the wireless transceiver 10 to another communication device, a base station, or the like. The elementary signal is supplied to the mixer 33 through the band-pass filter 34.

The band-pass filter 34 has a function of removing a noise component caused when the modulator 35 generates an elementary signal.

The mixer 33 has a function of mixing an elementary signal passing through the band-pass filter 34 and a signal 36 generated in the local oscillator 23 according to the superheterodyne principle. The mixer 33 mixes the elementary signal and the signal 36 and supplies, to the band-pass filter 32, a signal having a frequency component of the difference between these signals and a frequency component of the sum of these signals.

The band-pass filter 32 has a function of passing one of the two frequency components. For example, the band-pass filter 32 passes the sum frequency component. The band-pass filter 32 also has a function of removing a noise component caused in the mixer 33. The signal passing through the band-pass filter 32 is supplied to the power amplifier 31.

The power amplifier 31 has a function of amplifying the supplied signal and generating a signal 30. The signal 30 is emitted from the antenna 11 to the outside through the duplexer 20.

A signal 40 transmitted from another communication device, a base station, or the like is input as a reception signal to the low-noise amplifier 41 through the antenna 11 and the duplexer 20.

The low-noise amplifier 41 has a function of amplifying a weak reception signal into a signal with an intensity high enough to be processed in the wireless transceiver 10. The signal 40 amplified by low-noise amplifier 41 is supplied to the mixer 43 through the band-pass filter 42.

The band-pass filter 42 has a function of attenuating frequency components outside a necessary frequency range among frequency components included in the signal 40 and passing a frequency component in the necessary frequency range.

The mixer 43 has a function of mixing the signal 40 passing through the band-pass filter 42 and a signal 46 generated in the local oscillator 23 according to the superheterodyne principle. The mixer 43 mixes the signal 40 and the signal 46 and supplies, to the band-pass filter 44, a signal having a frequency component of the difference between these signals and a frequency component of the sum of these signals.

The band-pass filter 44 has a function of passing one of the two frequency components. For example, the band-pass filter 44 passes the difference frequency component. The band-pass filter 44 also has a function of removing a noise component caused in the mixer 43. The signal passing through the band-pass filter 44 is supplied to the demodulator 45. The demodulator 45 has a function of converting the supplied signal into a control signal, a data signal, or the like and outputting the signal. The signal output from the demodulator 45 is supplied to a variety of processing devices (e.g., an arithmetic device and a memory device).

Figure 1B:
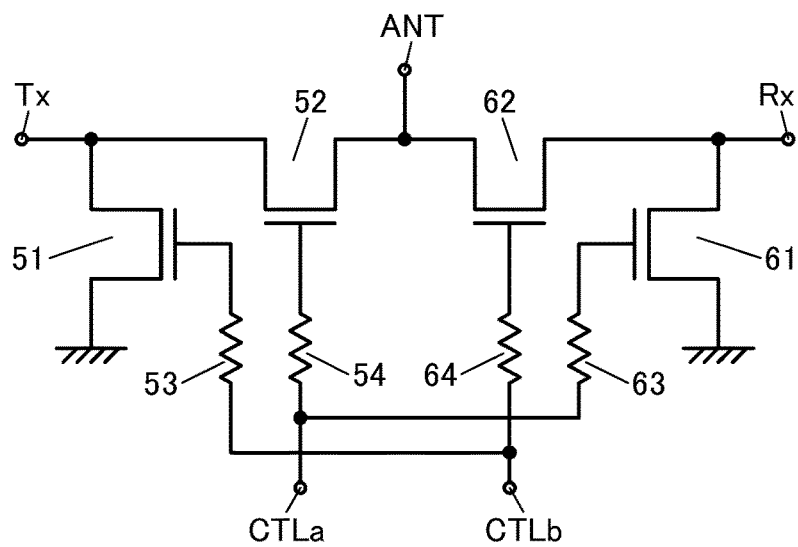
FIG. 1B is a circuit diagram illustrating a structure example of a communication device.

FIG. 1B is a circuit diagram illustrating a configuration example of the duplexer 20. The duplexer 20 includes a transistor 51, a transistor 52, a resistor 53, a resistor 54, a transistor 61, a transistor 62, a resistor 63, and a resistor 64.

The transmission terminal Tx is electrically connected to one of a source or a drain of the transistor 51 and one of a source and a drain of the transistor 52. The reception terminal Rx is electrically connected to one of a source and a drain of the transistor 61 and one of a source and a drain of the transistor 62. The antenna terminal ANT is electrically connected to the other of the source and the drain of the transistor 52 and the other of the source and the drain of the transistor 62.

A gate of the transistor 51 is electrically connected to one terminal of the resistor 53. A gate of the transistor 52 is electrically connected to one terminal of the resistor 54. A gate of the transistor 61 is electrically connected to one terminal of the resistor 63. A gate of the transistor 62 is electrically connected to one terminal of the resistor 64. The control terminal CTLa is electrically connected to the other terminal of the resistor 54 and the other terminal of the resistor 63. The control terminal CTLb is electrically connected to the other terminal of the resistor 53 and the other terminal of the resistor 64.

Here, for example, A and B that are connected to each other through a resistor can be regarded as being electrically connected to each other. Thus, the control terminal CTLa can be regarded as being electrically connected to the gate of the transistor 52 and the gate of the transistor 61. In addition, the control terminal CTLb can be regarded as being electrically connected to the gate of the transistor 51 and the gate of the transistor 62.

A constant potential can be supplied to the other of the source and the drain of the transistor 51 and the other of the source and the drain of the transistor 61. For example, a ground potential can be supplied. Alternatively, a negative potential may be supplied to the other of the source and the drain of the transistor 51 and the other of the source and the drain of the transistor 61. Here, the potential supplied to the other of the source and the drain of the transistor 51 and the other of the source and the drain of the transistor 61 can be used as a reference potential.

The following description will be made assuming that a ground potential is supplied to the other of the source and the drain of the transistor 51 and the other of the source and the drain of the transistor 61. In other words, the case where the reference potential is a ground potential will be described.

Figure 2A:
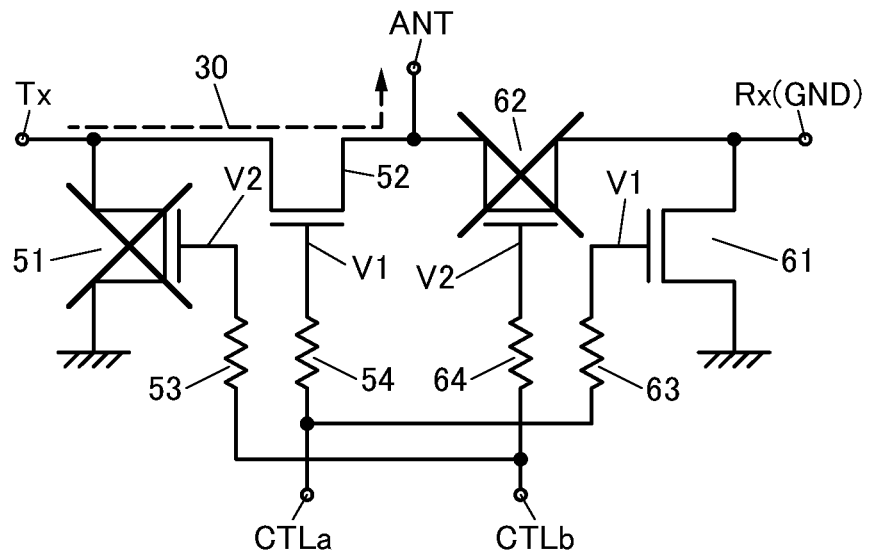
FIG. 2A and FIG. 2B are circuit diagrams each illustrating an example of a method for operating a communication device.
Figure 2B:
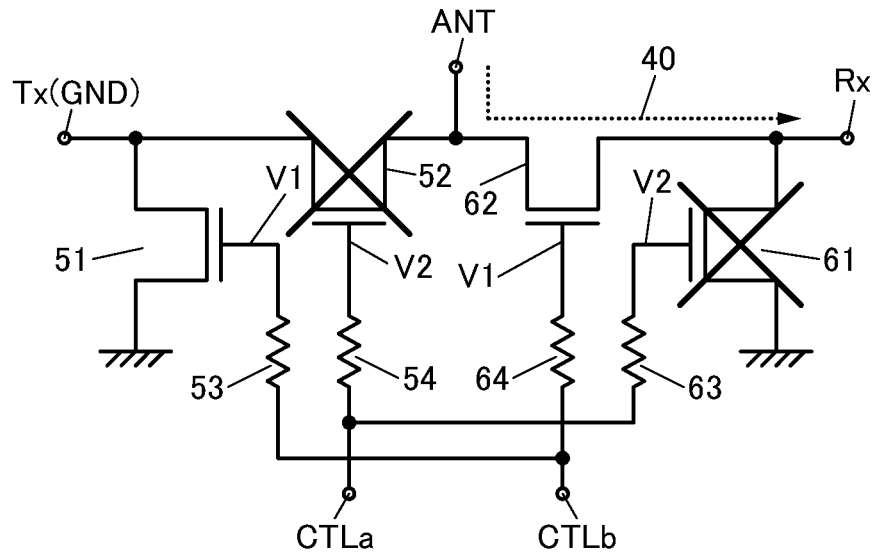

FIG. 2A and FIG. 2B are circuit diagrams each illustrating an example of a method for operating the wireless transceiver 10. In FIG. 2A and FIG. 2B, a symbol "x" is written on a transistor in an off state. This may apply to the other drawings.

FIG. 2A is a circuit diagram illustrating an example of a state of the duplexer 20 when the wireless transceiver 10 transmits the signal 30 to the outside of the wireless transceiver 10, i.e., when the wireless transceiver 10 performs transmission operation.

As illustrated in FIG. 2A, when the wireless transceiver 10 transmits the signal 30 to the outside of the wireless transceiver 10, the transistor 52 and the transistor 61 are turned on and the transistor 51 and the transistor 62 are turned off. The potential of the gate of the transistor 52 and the potential of the gate of the transistor 61 at this time are denoted by a potential V1, and the potential of the gate of the transistor 51 and the potential of the gate of the transistor 62 are denoted by a potential V2. In the case shown in FIG. 2A, the potential of the control terminal CTLa is a potential with which the potential of the gate of the transistor 52 and the potential of the gate of the transistor 61 become the potential V1. The potential of the control terminal CTLb is a potential with which the potential of the gate of the transistor 51 and the potential of the gate of the transistor 62 become the potential V2.

Accordingly, electrical continuity is established between the transmission terminal Tx and the antenna terminal ANT, and the signal 30 is transmitted from the transmission terminal Tx to the antenna terminal ANT. Since the transistor 61 is on, the potential of the reception terminal Rx becomes the potential of the other of the source and the drain of the transistor 61. For example, the potential of the reception terminal Rx becomes a ground potential GND as shown in FIG. 2A. Thus, the operation of a circuit electrically connected to the reception terminal Rx, such as the low-noise amplifier 41, can be stopped, whereby a malfunction of the wireless transceiver 10 can be suppressed.

FIG. 2B is a circuit diagram illustrating an example of a state of the duplexer 20 when the wireless transceiver 10 receives the signal 40 from the outside of the wireless transceiver 10, i.e., when the wireless transceiver 10 performs reception operation.

As illustrated in FIG. 2B, when the wireless transceiver 10 receives the signal 40 from the outside of the wireless transceiver 10, the transistor 51 and the transistor 62 are turned on and the transistor 52 and the transistor 61 are turned off. The potential of the gate of the transistor 51 and the potential of the gate of the transistor 62 at this time are denoted by the potential V1, and the potential of the gate of the transistor 52 and the potential of the gate of the transistor 61 are denoted by the potential V2. In the case shown in FIG. 2B, the potential of the control terminal CTLa is a potential with which the potential of the gate of the transistor 52 and the potential of the gate of the transistor 61 become the potential V2. The potential of the control terminal CTLb is a potential with which the potential of the gate of the transistor 51 and the potential of the gate of the transistor 62 become the potential V1.

Accordingly, electrical continuity is established between the antenna terminal ANT and the reception terminal Rx, and the signal 40 is transmitted from the antenna terminal ANT to the reception terminal Rx. Since the transistor 51 is on, the potential of the transmission terminal Tx becomes the potential of the other of the source and the drain of the transistor 51. For example, the potential of the transmission terminal Tx becomes the ground potential GND as shown in FIG. 2B. Thus, the operation of a circuit electrically connected to the transmission terminal Tx, such as the power amplifier 31, can be stopped, whereby a malfunction of the wireless transceiver 10 can be suppressed.

Accordingly, the potential V1 can be said to be a potential that turns on the transistor 51, the transistor 52, the transistor 61, and the transistor 62 by being supplied to the gates of the transistor 51, the transistor 52, the transistor 61, and the transistor 62. The potential V2 can be said to be a potential that turns off the transistor 51, the transistor 52, the transistor 61, and the transistor 62 by being supplied to the gates of the transistor 51, the transistor 52, the transistor 61, and the transistor 62. Thus, the transistor 51, the transistor 52, the transistor 61, and the transistor 62 can be regarded as having a function of a switch that is turned on when the gate potential is the potential V1 and is turned off when the gate potential is the potential V2.

Here, the potential V1 is preferably high. The reason is described with reference to FIG. 3A and FIG. 3B.

Figure 3A:
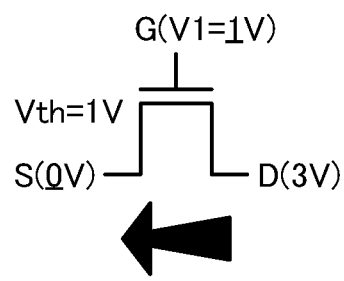
FIG. 3A and FIG. 3B are circuit diagrams each illustrating an example of a method for operating a communication device.
Figure 3B:
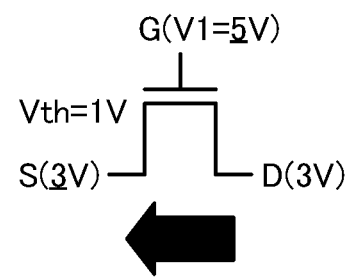

FIG. 3A and FIG. 3B each show the potential of a source (S) of a transistor in which the threshold voltage Vth is 1 V and the potential of a gate (G) is the potential V1, when a signal with 3 V is input to a drain (D). The potential V1 is 1 V in the case of FIG. 3A, and the potential V1 is 5 V in the case of FIG. 3B. Note that the on-state resistance of the transistor is ignored in FIG. 3A and FIG. 3B. A signal flow is indicated by an arrow in FIG. 3A and FIG. 3B.

It can be said that when a gate voltage Vg that is a difference between the gate potential and the source potential of the transistor becomes lower than the threshold voltage Vth, a drain current that is a current flowing between the drain and the source stops flowing. Thus, it is difficult for the source potential to become larger than the difference between the gate potential and the threshold potential Vth. Consequently, when the difference between the gate potential and the drain potential becomes smaller than the threshold voltage Vth as shown in FIG. 3A, the source potential becomes lower than the drain potential. Hence, when the gate potential is low, a change in the potential of the signal is likely to occur.

Meanwhile, when the gate potential is high, a change in the potential of the signal is less likely to occur even if the drain potential is high. In the case where the potential V1, which is the gate potential, is 5 V as shown in FIG. 3B, the potential of the signal does not change even when the drain potential is 3 V as in the case of FIG. 3A, and the source potential becomes 3 V.

From the above, the potential V1, which is supplied to the gate to turn on the transistor, is preferably high. However, when the gate potential of the transistor is too high, the transistor might be broken. Even if the transistor is not broken, the reliability of the transistor might be reduced. For example, in the case where the gate potential of a transistor that contains silicon as a semiconductor where a channel is formed (also referred to as a Si transistor) is set to 5 V as shown in FIG. 3B, the Si transistor might be broken or have reduced reliability when the source potential of the Si transistor is 0 V, for instance. Thus, when the difference between the gate potential of the Si transistor and the reference potential is more than or equal to 5 V, the Si transistor might be broken or have reduced reliability. Furthermore, the Si transistor might be broken or have reduced reliability when the gate potential is 2 V or higher, 1.8 V or higher, or 1.5 V or higher. Specifically, the Si transistor might be broken or have reduced reliability when the difference between the gate potential of the Si transistor and the reference potential is 2 V or more, 1.8 V or more, or 1.5 V or more.

Here, a transistor that contains an oxide semiconductor (OS), which is a type of metal oxide, as a semiconductor where a channel is formed (also referred to as an OS transistor) has a feature of higher withstand voltage than that of a Si transistor, for example. Therefore, when the gate potential of the OS transistor is set to 5 V as shown in FIG. 3B, the OS transistor is not broken or its reliability is not reduced.

For the 5G communication standards, high-frequency bands such as the 3.7 GHz band, the 4.5 GHz band, and the 28 GHz band are used. Thus, attenuation of radio waves increases; hence, the distance that a signal transmitted through the radio waves reaches becomes shorter. Consequently, in the case where the communication frequency is high, the amplitude of the potential of the signal is preferably increased. From the above, when the wireless transceiver 10 conforms particularly to the 5G communication standards, the transistor 52 and the transistor 62 included in the duplexer 20 are preferably OS transistors. In that case, the wireless transceiver 10 is capable of transmitting and receiving high-potential signals and thus can be used in high-frequency bands.

Here, the transistor 51 and the transistor 61 are also preferably OS transistors. That is, all the transistors 51, 52, 61, and 62 are preferably OS transistors. The reason is described with reference to FIG. 4A, FIG. 4B1, and FIG. 4B2.

Figure 4A:
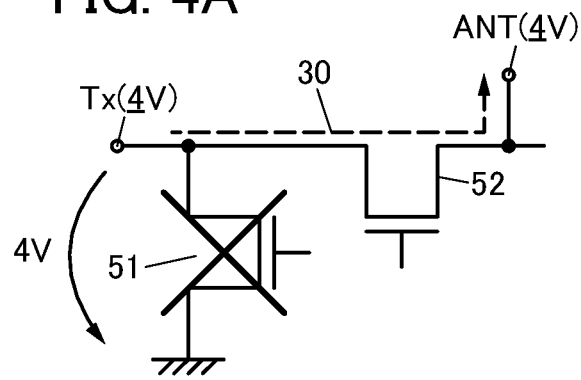

FIG. 4A and FIG. 4B1 are circuit diagrams that only show the transistor 51, the transistor 52, the transmission terminal Tx, and the antenna terminal ANT among the components of the duplexer 20 in FIG. 1B.

FIG. 4A shows the case where the transistor 51 is turned off and the transistor 52 is turned on. That is, FIG. 4A shows the case where the wireless transceiver 10 performs transmission operation.

In the case shown in FIG. 4A, the signal 30 with 4 V is transmitted from the transmission terminal Tx to the antenna terminal ANT. In this case, the potential of the transmission terminal Tx and the potential of the antenna terminal ANT become 4 V. Note that a change in the potential of the signal 30 associated with the transmission of the signal 30 from the transmission terminal Tx to the antenna terminal ANT is not taken into consideration.

When the potential of the transmission terminal Tx is set to 4 V as shown in FIG. 4A, a voltage Vds that is a difference between the drain potential and the source potential of the transistor 51 becomes 4 V. Thus, when the transistor 51 is a transistor with low withstand voltage, such as a Si transistor, there is a possibility that the transistor 51 is broken. Even if the transistor is not broken, the reliability of the transistor might be decreased. Specifically, the Si transistor might be broken or have reduced reliability when the voltage Vds of the Si transistor is 4 V or higher. Furthermore, the Si transistor might be broken or have reduced reliability when the voltage Vds is 3 V or higher, 2 V or higher, or 1.5 V or higher. From the above, the transistor 51 is preferably a transistor with high withstand voltage, such as an OS transistor.

FIG. 4B1 shows the case where the transistor 51 is turned on and the transistor 52 is turned off. That is, FIG. 4B1 shows the case where the wireless transceiver 10 performs reception operation.

In the case shown in FIG. 4B1, the potential of the transmission terminal Tx becomes 0 V, for example. Here, the potential of the antenna terminal ANT is set to 4 V as in the case shown in FIG. 4A. In this case, the voltage Vds of the transistor 52 becomes 4 V. Thus, when the transistor 52 is a transistor with low withstand voltage, such as a Si transistor, the transistor 52 might be broken or its reliability might be reduced.

For that reason, in the case where the transistor 52 is a Si transistor, for example, it is necessary to provide a plurality of transistors 52 in series and provide resistors 72 in parallel with the transistors 52 as illustrated in FIG. 4B2. In the configuration illustrated in FIG. 4B2, a transistor 52[1] and a transistor 52[2] are provided as the transistors 52, and a resistor 72[1] and a resistor 72[2] are provided as the resistors 72. The antenna terminal ANT is electrically connected to one of a source and a drain of the transistor 52[1] and one terminal of the resistor 72[1]. The other of the source and the drain of the transistor 52[1] is electrically connected to one of a source and a drain of the transistor 52[2], the other terminal of the resistor 72[1], and one terminal of the resistor 72[2]. The transmission terminal Tx is electrically connected to one of the source and the drain of the transistor 51, the other of the source and the drain of the transistor 52[2], and the other terminal of the resistor 72[2].

In the case shown in FIG. 4B2, the voltage Vds of the transistor 52 becomes 2 V even when the potential of the antenna terminal ANT is 4 V and the potential of the transmission terminal Tx is 0 V as in the case shown in FIG. 4B1. Accordingly, the voltage Vds of the transistor 52 can be lowered as compared to the case shown in FIG. 4B1. However, the number of transistors and the like included in the duplexer 20 increases, and the area occupied by the duplexer 20 increases. Thus, the size of the wireless transceiver 10 increases. Moreover, even when the transistor 52 is off, current flows from the antenna terminal ANT to the transmission terminal Tx through the resistors 72. Thus, the potential of a signal transmitted inside the duplexer 20 changes, so that the wireless transceiver 10 cannot transmit and receive signals accurately.

On the other hand, an OS transistor is not broken or its reliability is not reduced even when the voltage Vds is 4 V or higher. Specifically, an OS transistor is not broken or its reliability is not reduced when the voltage Vds is 5 V or lower. There is a possibility that an OS transistor is not broken or its reliability is not reduced when the voltage Vds is 20 V. Thus, when the transistor 52 is an OS transistor, the number of transistors 52 provided in the duplexer 20 can be reduced as compared to the case where the transistors 52 are transistors with low withstand voltage, such as Si transistors. Hence, the size of the wireless transceiver 10 can be small. Furthermore, the resistors 72 that are connected in parallel with the transistors 52 do not need to be provided. Consequently, it is possible to achieve not only a reduction in size of the wireless transceiver 10 but also accurate transmission and reception of signals with the wireless transceiver 10.

Note that the transistor 61 and the transistor 62 are also preferably OS transistors. For the reason, the description using FIG. 4A, FIG. 4B1, and FIG. 4B2 can be employed by replacing the transistor 51 with the transistor 61, replacing the transistor 52 with the transistor 62, replacing the transmission terminal Tx with the reception terminal Rx, and replacing the signal 30 with the signal 40, for example.

The other reason the transistor 51, the transistor 52, the transistor 61, and the transistor 62 are preferably OS transistors is described. The OS transistor has a feature of extremely low off-state current. Thus, when the transistor 51, the transistor 52, the transistor 61, and the transistor 62 are OS transistors, a change in the potential of a signal transmitted inside the duplexer 20 can be suppressed. Specifically, in the case where the signal 30 is transmitted from the transmission terminal Tx to the antenna terminal ANT as illustrated in FIG. 2A, a change in the potential of the signal 30 due to leakage current flowing through the transistor 51 and the transistor 62 that are in the off state can be suppressed. In the case where the signal 40 is transmitted from the antenna terminal ANT to the reception terminal Rx as illustrated in FIG. 2B, a change in the potential of the signal 40 due to leakage current flowing through the transistor 52 and the transistor 61 that are in the off state can be suppressed. Consequently, the wireless transceiver 10 can transmit and receive signals with high accuracy.

Here, the gate of the transistor to be turned off is preferably supplied with a potential that is as low as possible. That is, the potential V2 is preferably as low as possible. For example, the potential V2 is preferably lower than the reference potential. For example, in the case where the reference potential is a ground potential, the potential V2 is preferably a negative potential. Making the potential V2 as low as possible can reduce leakage current flowing through the transistor in the off state. The relation between the gate potential and the off-state current is described below.

Figure 5A:
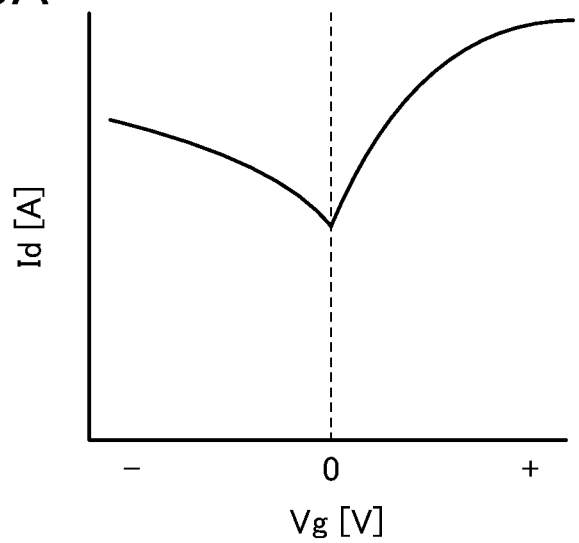
FIG. 5A and FIG. 5B are diagrams each showing Id-Vg characteristics of a transistor.
Figure 5B:
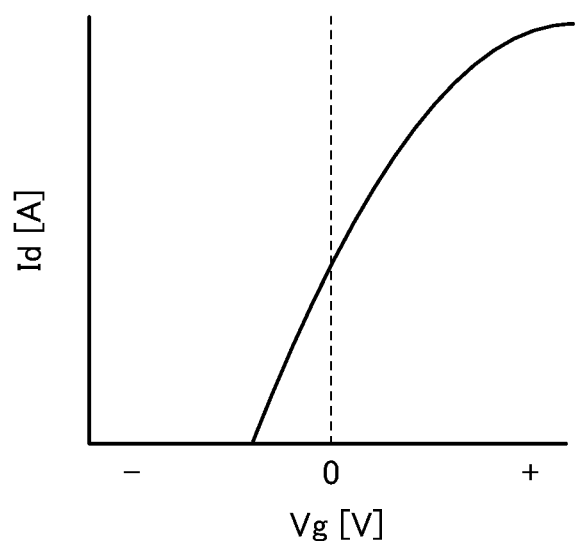

FIG. 5A is a graph showing the Id-Vg characteristics of a Si transistor, and FIG. 5B is a graph showing the Id-Vg characteristics of an OS transistor. In FIG. 5A and FIG. 5B, the horizontal axis represents the gate voltage Vg, which is a difference between a gate potential and a source potential, on a linear scale, and the vertical axis represents a drain current Id flowing between a source and a drain in a log scale.

As shown in FIG. 5A, in the Si transistor, the drain current Id increases when the gate voltage Vg becomes too low. Specifically, when the gate voltage Vg becomes negative, the drain current Id might increase compared to the case where the gate voltage Vg is 0 V. Thus, for example, when the gate potential of the Si transistor is set lower than the reference potential, the drain current Id that is the off-state current might become larger than that when the gate potential is set equal to the reference potential. For example, in the case where the reference potential is a ground potential, when the gate potential is set to a negative potential, the off-state current might be larger than that when the gate potential is set to a ground potential.

On the other hand, as shown in FIG. 5B, in the OS transistor, the drain current Id keeps decreasing when the gate voltage Vg is lower. Thus, the gate voltage Vg of the OS transistor can be reduced. For example, when the gate potential of the OS transistor is set lower than the reference potential, the off-state current becomes lower than that when the gate potential is set equal to the reference potential. For example, in the case where the reference potential is a ground potential, when the gate potential is set to a negative potential, the off-state current becomes lower than that when the gate potential is set to a ground potential.

From the reasons described above, the transistor 51, the transistor 52, the transistor 61, and the transistor 62 included in the duplexer 20 are preferably OS transistors.

Figure 6A:
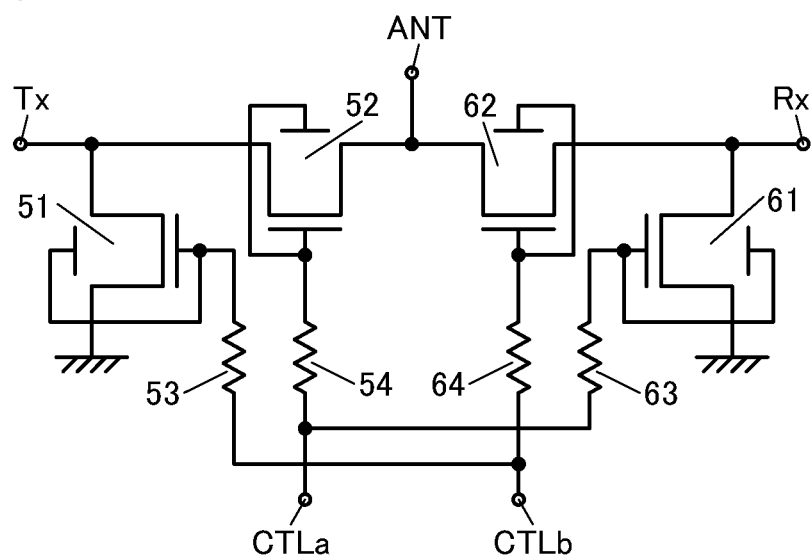
FIG. 6A and FIG. 6B are circuit diagrams illustrating structure examples of a communication device.

Note that at least one of the transistors 51, 52, 61, and 62 may be a transistor having a back gate. FIG. 6A is a circuit diagram illustrating a configuration example of the duplexer 20 in which the transistor 51, the transistor 52, the transistor 61, and the transistor 62 are transistors having back gates. FIG. 6A illustrates an example where the gate and the back gate of each transistor are electrically connected to each other; however, one embodiment of the present invention is not limited thereto. For example, a wiring to which a constant potential is supplied may be electrically connected to the back gate. Alternatively, the potential of the back gate of the transistor may be controlled independently of the potential of the gate of the transistor.

The back gate is placed so that a channel formation region in the semiconductor is positioned between the gate and the back gate. By changing the potential of the back gate, the threshold voltage of the transistor can be changed. The potential of the back gate may be set the same as the potential of the gate or may be set to a ground potential or a given potential. In addition, the back gate can function in a manner similar to that of the gate. Thus, the gate and the back gate are interchangeable. For example, in some cases, one of the gate and the back gate is referred to as a "first gate" and the other is referred to as a "second gate".

In general, the gate and the back gate are formed using conductors and thus also have a function of preventing an electric field generated outside the transistor from affecting the semiconductor where a channel is formed (particularly a function of blocking static electricity). That is, a variation in the electrical characteristics of the transistor due to the influence of an external electric field such as static electricity can be suppressed.

Figure 6B:
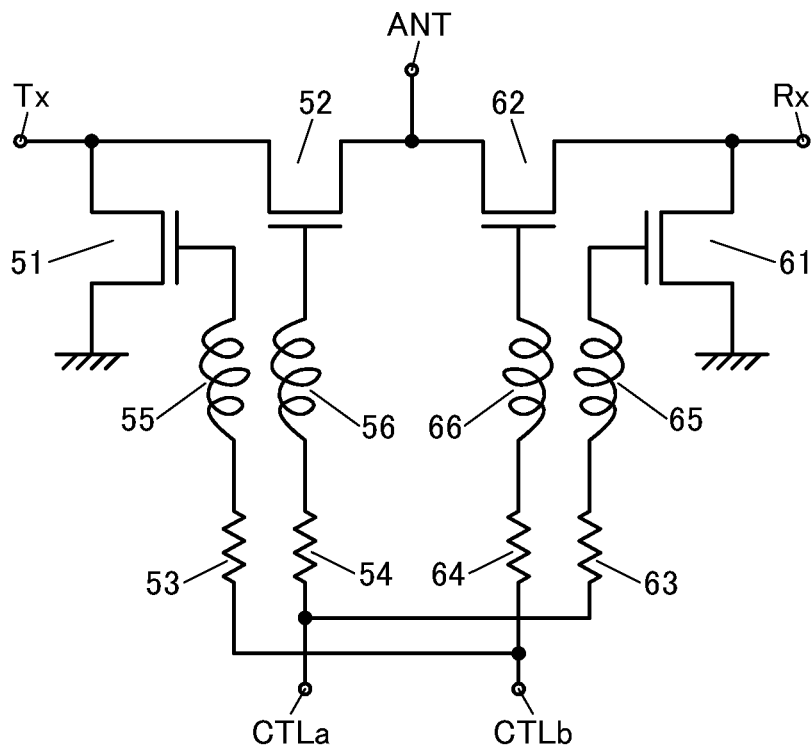

An inductor may be provided at at least one of the following: between the gate of the transistor 51 and the resistor 53, between the gate of the transistor 52 and the resistor 54, between the gate of the transistor 61 and the resistor 63, and between the gate of the transistor 62 and the resistor 64. FIG. 6B is a circuit diagram illustrating a configuration example of the duplexer 20 in which an inductor 55, an inductor 56, an inductor 65, and an inductor 66 are provided. Note that the inductor is also referred to as a coil.

In the duplexer 20 having the configuration illustrated in FIG. 6B, one terminal of the inductor 55 is electrically connected to the gate of the transistor 51, and the other terminal of the inductor 55 is electrically connected to one terminal of the resistor 53. One terminal of the inductor 56 is electrically connected to the gate of the transistor 52, and the other terminal of the inductor 56 is electrically connected to one terminal of the resistor 54. One terminal of the inductor 65 is electrically connected to the gate of the transistor 61, and the other terminal of the inductor 65 is electrically connected to one terminal of the resistor 63. One terminal of the inductor 66 is electrically connected to the gate of the transistor 62, and the other terminal of the inductor 66 is electrically connected to one terminal of the resistor 64.

As described above, for example, A and B that are connected to each other through a resistor can be regarded as being electrically connected to each other. As another example, A and B that are connected to each other through an inductor can be regarded as being electrically connected to each other. Accordingly, the control terminal CTLa can be regarded as being electrically connected to the gate of the transistor 52 and the gate of the transistor 61. In addition, the control terminal CTLb can be regarded as being electrically connected to the gate of the transistor 51 and the gate of the transistor 62.

When the duplexer 20 has the configuration illustrated in FIG. 6B, even if the signal 30, which is transmitted from the transmission terminal Tx to the antenna ANT, and the signal 40, which is transmitted from the antenna terminal ANT to the reception terminal Rx, are high-frequency signals, changes in the potentials of the signal 30 and the signal 40 can be suppressed. Thus, the wireless transceiver 10 can transmit and receive signals accurately. The wireless transceiver 10 can accurately transmit and receive signals particularly when the wireless transceiver 10 conforms to communication standards using high-frequency bands, such as the 5G.

Figure 7A:
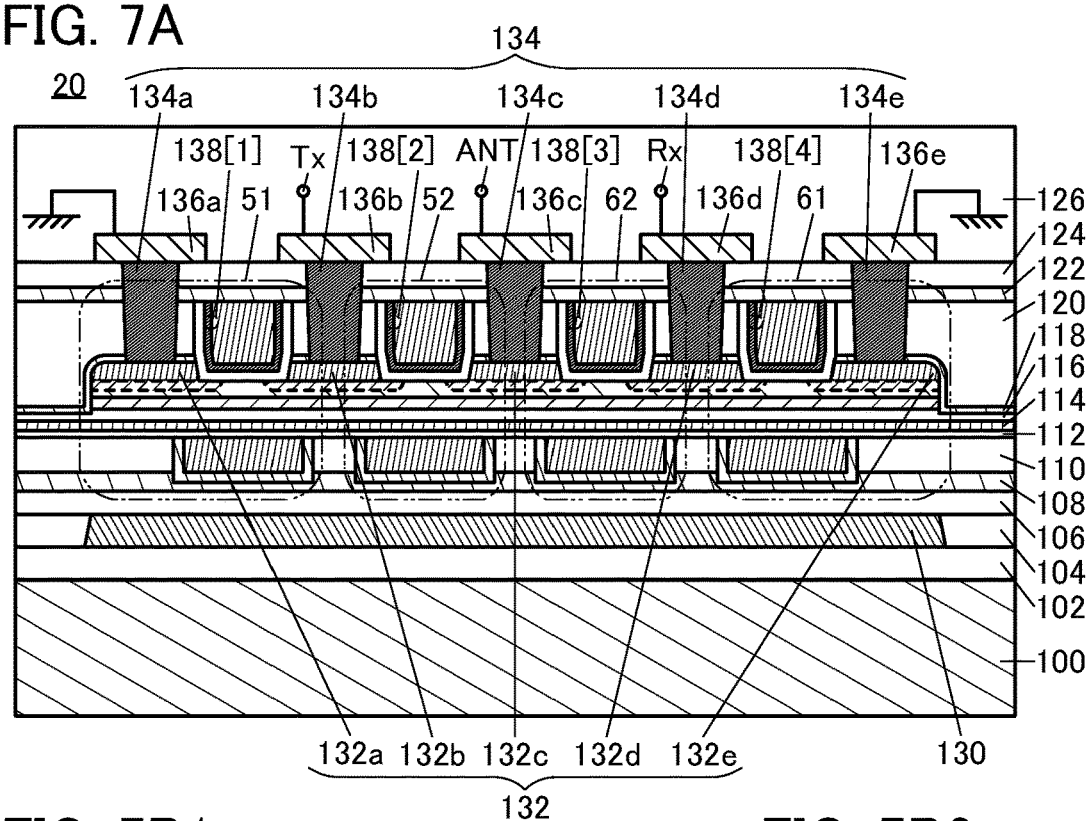
FIG. 7A is a cross-sectional view illustrating a structure example of a communication device.
Figure 7A:
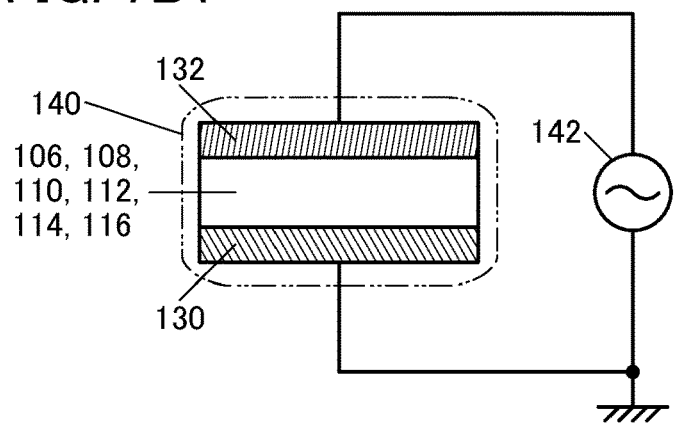
Figure 7A:
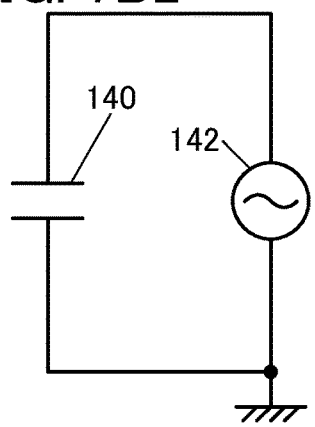
Figure 7A:
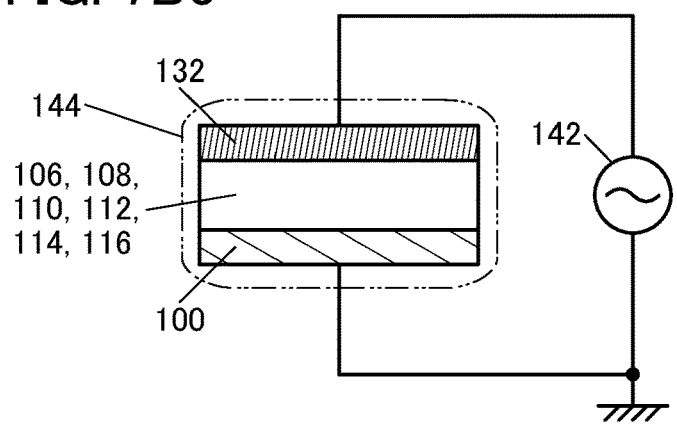
Figure 7A:
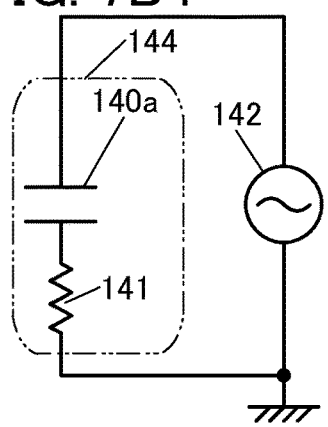
Figure 8A:
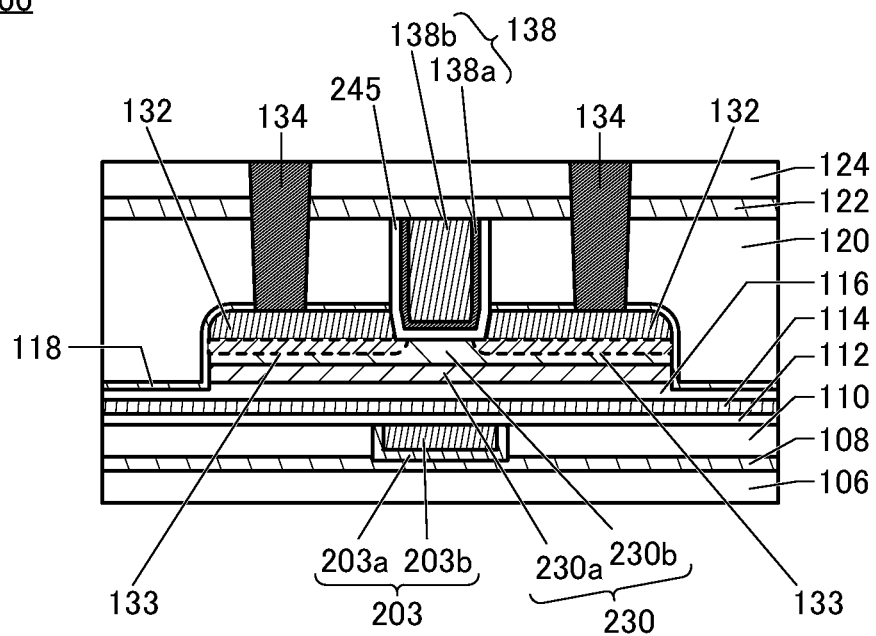
FIG. 8A and FIG. 8B are cross-sectional views illustrating a structure example of a transistor.
Figure 8B:
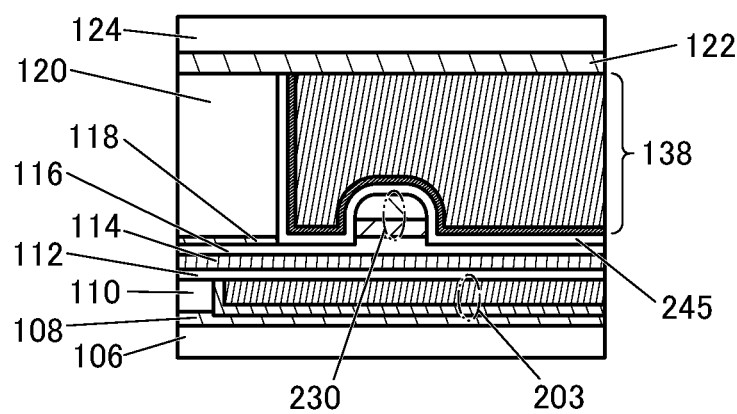

FIG. 7A illustrates an example of a cross-sectional structure of the wireless transceiver 10. FIG. 7A illustrates the transistor 51, the transistor 52, the transistor 61, and the transistor 62, which are illustrated in FIG. 1B and the like. FIG. 8A is a cross-sectional view, in the channel length direction, of a transistor 200 that can be used as the transistor 51, the transistor 52, the transistor 61, and the transistor 62, and FIG. 8B is a cross-sectional view of the transistor 200 in the channel width direction. As described above, the transistor 51, the transistor 52, the transistor 61, and the transistor 62 are OS transistors. Accordingly, the transistor 200 is an OS transistor.

As illustrated in FIG. 7A, an insulator 102 is provided over a substrate 100. As the substrate 100, it is possible to use a silicon substrate, a glass substrate, a quartz substrate, a sapphire substrate, a ceramic substrate, a metal substrate (e.g., a stainless steel substrate, a substrate including stainless steel foil, a tungsten substrate, or a substrate including tungsten foil), a semiconductor substrate (e.g., a single crystal semiconductor substrate, a polycrystalline semiconductor substrate, or a compound semiconductor substrate), an SOI (Silicon on Insulator) substrate, or the like. Alternatively, a plastic substrate having heat resistance to the processing temperature in this embodiment may be used. Examples of the glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base material film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a communication device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a communication device may be formed over one substrate and then transferred to another substrate. Examples of a substrate to which a communication device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible communication device or a highly durable communication device can be manufactured, high heat resistance can be provided, or a reduction in weight or thickness can be achieved.

Providing a communication device over a flexible substrate can suppress an increase in weight and can produce a non-breakable communication device.

An insulator 104 and a conductor 130 are provided over the insulator 102. The conductor 130 is supplied with the reference potential, for example. The function and the like of the conductor 130 will be described later.

As a material for the conductor 130, a conductive material such as a metal material, an alloy material, a metal nitride material, or a metal oxide material can be used as a single layer or stacked layers. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

An insulator 106 is provided over the insulator 104 and the conductor 130. The transistor 51, the transistor 52, the transistor 61, and the transistor 62 are provided over the insulator 106.

As illustrated in FIG. 8A and FIG. 8B, the transistor 200 includes an insulator 108 over the insulator 106, an insulator 110 over the insulator 108, a conductor 203 positioned to be embedded in the insulator 108 and the insulator 110, an insulator 112 positioned over the insulator 110 and the conductor 203, an insulator 114 positioned over the insulator 112, an insulator 116 positioned over the insulator 114, a metal oxide 230a positioned over the insulator 116, a metal oxide 230b positioned over the metal oxide 230a, two conductors 132 positioned apart from each other over the metal oxide 230b, an insulator 120 which is positioned over the conductors 132 and in which an opening is formed to overlap a region between the two conductors 132, an insulator 245 positioned on a bottom surface and a side surface of the opening, and a conductor 138 positioned over the formation surface of the insulator 245.

As illustrated in FIG. 8A and FIG. 8B, an insulator 118 is preferably provided between the insulator 120 and the metal oxide 230a, the metal oxide 230b, and the conductor 132. As illustrated in FIG. 8A and FIG. 8B, the conductor 138 preferably includes a conductor 138a provided on the inner side of the insulator 245 and a conductor 138b provided to be embedded on the inner side of the conductor 138a. Moreover, as illustrated in FIG. 8A and FIG. 8B, an insulator 122 is preferably provided over the insulator 120, the conductor 138, and the insulator 245.

Note that in this specification and the like, the metal oxide 230a and the metal oxide 230b are sometimes collectively referred to as a metal oxide 230.

Note that although a structure of the transistor 200 in which two layers of the metal oxide 230a and the metal oxide 230b are stacked in a region where a channel is formed and its vicinity is shown, the present invention is not limited thereto. For example, the metal oxide 230 may be a single layer of the metal oxide 230b or may have a stacked-layer structure of three or more layers.

Furthermore, although the conductor 138 is shown to have a stacked-layer structure of two layers in the transistor 200, the present invention is not limited thereto. For example, the conductor 138 may have a single-layer structure or a stacked-layer structure of three or more layers. Note that the transistor 200 illustrated in FIG. 8A and FIG. 8B is only an example and the structure is not limited thereto; a transistor appropriate for a circuit configuration, an operating method, or the like is used.

Here, the conductor 138 functions as a gate of the transistor 200. One of the two conductors 132 functions as a source of the transistor 200, and the other functions as a drain of the transistor 200.

In FIG. 7A, the conductor 138 included in the transistor 51 is denoted by a conductor 138[1], the conductor 138 included in the transistor 52 is denoted by a conductor 138[2], the conductor 138 included in the transistor 62 is denoted by a conductor 138[3], and the conductor 138 included in the transistor 61 is denoted by a conductor 138[4]. Although not illustrated in FIG. 7A, the conductor 138[1] and the conductor 138[3] are electrically connected to the control terminal CTLb. Moreover, the conductor 138[2] and the conductor 138[4] are electrically connected to the control terminal CTLa.

FIG. 7A shows a conductor 132a, a conductor 132b, a conductor 132c, a conductor 132d, and a conductor 132e as the conductors 132. The conductor 132a functions as the other of the source and the drain of the transistor 51. The conductor 132b functions as one of the source and the drain of the transistor 51 and one of the source and the drain of the transistor 52. The conductor 132c functions as the other of the source and the drain of the transistor 52 and the other of the source and the drain of the transistor 62. The conductor 132d functions as one of the source and the drain of the transistor 62 and one of the source and the drain of the transistor 61. The conductor 132e functions as the other of the source and the drain of the transistor 61.

As described above, the conductor 138 is formed to be embedded in the opening of the insulator 120 and the region positioned between the two conductors 132. The conductor 138 and the two conductors 132 are arranged in a self-aligned manner with respect to the opening of the insulator 120. That is, in the transistor 200, the gate can be positioned between the source and the drain in a self-aligned manner. Thus, the conductor 138 can be formed without an alignment margin, resulting in a reduction in the area occupied by the transistor 200. Consequently, the communication device of one embodiment of the present invention can be miniaturized or highly integrated.

Since the conductor 138 is formed in the region between the two conductors 132 in a self-aligned manner, the conductor 138 does not include a region overlapping the two conductors 132. Thus, parasitic capacitance formed between the conductor 138 and the two conductors 132 can be reduced. This increases the switching speed of the transistor 200, whereby the frequency characteristics of the communication device of one embodiment of the present invention can be improved.

The conductor 138 sometimes functions as a first gate. The conductor 203 sometimes functions as a second gate. Here, the conductor 203 is placed so as to include a region overlapped by the metal oxide 230 and the conductor 138. Thus, when potentials are supplied to the conductor 138 and the conductor 203, an electric field generated from the conductor 138 and an electric field generated from the conductor 203 are connected, thereby covering the channel formation region formed in the metal oxide 230.

In this specification and the like, a transistor structure in which a channel formation region is electrically surrounded by electric fields of a pair of gates (a first gate and a second gate) is referred to as a Surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 8A, as the conductor 203, a conductor 203a is formed in contact with an inner wall of an opening provided in the insulator 108 and the insulator 110, and a conductor 203b is formed on the inner side. Although the transistor 200 having a structure in which the conductor 203a and the conductor 203b are stacked is illustrated, the present invention is not limited thereto. For example, the conductor 203 may be provided as a single layer or to have a stacked-layer structure of three or more layers.

Here, for the conductor 203a, it is preferable to use a conductive material that has a function of inhibiting diffusion of impurities such as a hydrogen atom, a hydrogen molecule, a water molecule, and a copper atom (a conductive material through which the impurities are less likely to pass). Alternatively, it is preferable to use a conductive material that has a function of inhibiting diffusion of oxygen (e.g., at least one of an oxygen atom, an oxygen molecule, and the like) (a conductive material through which oxygen is less likely to pass). Note that in this specification, a function of inhibiting diffusion of impurities or oxygen means a function of inhibiting diffusion of any one or all of the impurities and oxygen.

For example, when the conductor 203a has a function of inhibiting diffusion of oxygen, a reduction in conductivity of the conductor 203b due to oxidation can be inhibited.

In the case where the conductor 203 also functions as a wiring, a conductive material that has high conductivity and contains tungsten, copper, or aluminum as its main component is preferably used for the conductor 203b. Note that although the conductor 203 is shown as a stack of the conductor 203a and the conductor 203b in this embodiment, the conductor 203 may have a single-layer structure.

The insulator 112, the insulator 114, and the insulator 116 have a function of an insulating film associated with the second gate, that is, a second gate insulating film.

Here, the concentration of impurities such as water or hydrogen in the insulator 116 is preferably low. In that case, entry of impurities such as water or hydrogen into the metal oxide 230 can be inhibited, for example. Here, diffusion of hydrogen into a semiconductor element including an oxide semiconductor, such as the transistor 200, degrades the characteristics of the semiconductor element in some cases. According to the above, a low concentration of impurities such as water or hydrogen contained in the insulator 116 can suppress a change in electrical characteristics of the transistor 200.

Here, as the insulator 116 in contact with the metal oxide 230, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 116. When such an insulator containing excess oxygen is provided in contact with the metal oxide 230, oxygen vacancies ($V_O$) in the metal oxide 230 can be reduced and the reliability of the transistor 200 can be improved. When hydrogen enters oxygen vacancies in the metal oxide 230, such defects (hereinafter referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally on characteristics. Moreover, hydrogen in an oxide semiconductor is easily transferred by a stress such as heat or an electric field; hence, a large amount of hydrogen in an oxide semiconductor might decrease the reliability of the transistor. In one embodiment of the present invention, $V_OH$ in the metal oxide 230 is preferably reduced as much as possible so that the metal oxide 230 becomes highly purified intrinsic or substantially highly purified intrinsic. In order to obtain such an oxide semiconductor with sufficiently reduced $V_OH$, it is important to remove impurities such as moisture or hydrogen in the oxide semiconductor (sometimes referred to as "dehydration" or "dehydrogenation treatment") and to compensate for oxygen vacancies by supplying oxygen to the oxide semiconductor (sometimes referred to as "oxygen adding treatment"). When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including an excess-oxygen region and the metal oxide 230 are in contact with each other. By the treatment, water or hydrogen in the metal oxide 230 can be removed. For example, in the metal oxide 230, a reaction in which a bond of $V_OH$ is cut occurs, i.e., a reaction "$V_OH \rightarrow V_O + H$" occurs; hence, the metal oxide 230 can be dehydrogenated. Some hydrogen generated at this time is bonded to oxygen to be H$_2$O, and removed from the metal oxide 230 or an insulator near the metal oxide 230 in some cases. Some hydrogen is gettered into the conductor 132 in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated. Application of the RF to the substrate side allows the oxygen radicals generated by the high-density plasma to be efficiently introduced into the metal oxide 230 or an insulator in the vicinity of the metal oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In the manufacturing process of the transistor 200, heat treatment is preferably performed with the surface of the metal oxide 230 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This provides oxygen to the metal oxide 230 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the metal oxide 230 can promote a reaction in which oxygen vacancies in the metal oxide 230 are filled with supplied oxygen, i.e., a reaction "Vo+O→null". Furthermore, hydrogen remaining in the metal oxide 230 reacts with supplied oxygen, so that the hydrogen can be removed as $H_2O$ (dehydration can be caused). This can inhibit recombination of hydrogen remaining in the metal oxide 230 with oxygen vacancies and formation of $V_OH$.

When the insulator 116 includes an excess-oxygen region, the insulator 114 preferably has a function of inhibiting diffusion of oxygen (e.g., oxygen atoms and oxygen molecules) (i.e., it is preferable that the insulator 114 do not easily transmit oxygen).

When the insulator 114 has a function of inhibiting diffusion of oxygen and impurities, oxygen contained in the metal oxide 230 is not diffused to the insulator 112 side, which is preferable. Furthermore, the conductor 203 can be inhibited from reacting with oxygen contained in the insulator 116 or the metal oxide 230, which is preferable.

For the insulator 114, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as a gate insulating film, the potential of a gate during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (an insulating material through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. The insulator 114 formed using such a material functions as a layer inhibiting oxygen release from the metal oxide 230 and entry of impurities such as hydrogen into the metal oxide 230 from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 112 be thermally stable. For example, silicon oxide and silicon oxynitride are suitable because they are thermally stable.

Note that in this specification and the like, silicon oxynitride refers to a material that has a higher oxygen content than a nitrogen content, and silicon nitride oxide refers to a material that has a higher nitrogen content than an oxygen content. Moreover, in this specification and the like, aluminum oxynitride refers to a material that has a higher oxygen content than a nitrogen content, and aluminum nitride oxide refers to a material that has a higher nitrogen content than an oxygen content.

Note that in the transistor 200 in FIG. 8A and FIG. 8B, the insulator 112, the insulator 114, and the insulator 116 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 200, a metal oxide functioning as an oxide semiconductor is used as the metal oxide 230 including the channel formation region. For the metal oxide 230, a metal oxide such as an In-M-Zn oxide (an element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used, for example.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the metal oxide 230 has a band gap of preferably 2 eV or higher, further preferably 2.5 eV or higher. With the use of a metal oxide having such a wide band gap, the off-state current of the transistor can be reduced.

The metal oxide 230 includes the metal oxide 230a under the metal oxide 230b, whereby diffusion of impurities into the metal oxide 230b from components formed below the metal oxide 230a can be inhibited.

Note that the metal oxide 230 preferably has a stacked-layer structure of a plurality of oxide layers that differ in the atomic ratio of metal atoms. Specifically, the atomic proportion of the element M in the constituent elements in the metal oxide used as the metal oxide 230a is preferably higher than that in the metal oxide used as the metal oxide 230b. The atomic ratio of the element M to In in the metal oxide used as the metal oxide 230a is preferably higher than that in the metal oxide used as the metal oxide 230b. The atomic ratio of In to the element M in the metal oxide used as the metal oxide 230b is preferably higher than that in the metal oxide used as the metal oxide 230a.

The energy of the conduction band minimum of the metal oxide 230a is preferably higher than the energy of the conduction band minimum of the metal oxide 230b. In other words, the electron affinity of the metal oxide 230a is preferably smaller than the electron affinity of the metal oxide 230b.

Here, the energy level of the conduction band minimum changes gradually at a junction portion between the metal oxide 230a and the metal oxide 230b. In other words, the energy level of the conduction band minimum at the junction portion between the metal oxide 230a and the metal oxide 230b continuously changes or is continuously connected. This can be achieved by decrease in the density of defect states in a mixed layer formed at the interface between the metal oxide 230a and the metal oxide 230b.

Specifically, when the metal oxide 230a and the metal oxide 230b contain the same element (as a main component) in addition to oxygen, a mixed layer with a low density of defect states can be formed. For example, in the case where the metal oxide 230b is an In—Ga—Zn oxide, it is preferable to use an In—Ga—Zn oxide, a Ga—Zn oxide, gallium oxide, or the like for the metal oxide 230a.

At this time, the metal oxide 230b serves as a main carrier path. When the metal oxide 230a has the above structure, the density of defect states at the interface between the metal oxide 230a and the metal oxide 230b can be made low. Thus, the influence of interface scattering on carrier conduction is small, and the transistor 200 can have a high on-state current.

The conductors 132 functioning as the source and the drain are provided over the metal oxide 230b. For the conductors 132, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

The conductors 132 are shown to have a single-layer structure in FIG. 8A, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

As illustrated in FIG. 8A, regions 133 are sometimes formed as low-resistance regions in the metal oxide 230 at and around the interfaces between the metal oxide 230 and the conductors 132. Since the transistor 200 includes the two conductors 132 as described above, the transistor 200 includes two regions 133. One of the two regions 133 functions as one of a source region and a drain region. The other of the two regions 133 functions as the other of the source region and the drain region. The channel formation region is formed in a region positioned between the two regions 133.

When the conductors 132 are provided in contact with the metal oxide 230, the oxygen concentration in the regions 133 sometimes decreases. In addition, a metal compound layer that contains the metal contained in the conductors 132 and the component of the metal oxide 230 is sometimes formed in the regions 133. In such a case, the carrier density of the regions 133 increases, and the regions 133 become low-resistance regions.

The insulator 118 is provided to cover the conductors 132 and inhibits oxidation of the conductors 132. The insulator 118 may be provided to cover the side surface of the metal oxide 230 and to be in contact with the insulator 116.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 118. Moreover, silicon nitride oxide, silicon nitride, or the like can be used for the insulator 118.

For the insulator 118, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 118 is not an essential component when the conductor 132 is an oxidation-resistant material or is a material that does not significantly lose its conductivity even after absorbing oxygen. Design is appropriately set in consideration of required transistor characteristics.

When the insulator 118 is included, diffusion of impurities such as water and hydrogen contained in the insulator 120 into the metal oxide 230b through the insulator 245 can be inhibited. Moreover, oxidation of the conductor 138 due to excess oxygen contained in the insulator 120 can be inhibited.

The insulator 245 has a function of an insulating film associated with the first gate, that is, a first gate insulating film. Like the insulator 116, the insulator 245 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 245, oxygen can be effectively supplied from the insulator 245 to the channel formation region of the metal oxide 230b. Furthermore, as in the insulator 116, the concentration of impurities such as water or hydrogen in the insulator 245 is preferably reduced. The thickness of the insulator 245 is preferably greater than or equal to 1 nm and less than or equal to 20 nm.

In order to efficiently supply excess oxygen in the insulator 245 to the metal oxide 230, a metal oxide may be provided between the insulator 245 and the conductor 138. The metal oxide preferably has a function of inhibiting oxygen diffusion from the insulator 245 into the conductor 138. Providing the metal oxide that has a function of inhibiting oxygen diffusion inhibits diffusion of excess oxygen from the insulator 245 into the conductor 138. That is, the reduction in the amount of excess oxygen supplied to the metal oxide 230 can be inhibited. Moreover, oxidation of the conductor 138 due to excess oxygen can be inhibited. For the metal oxide, a material that can be used for the insulator 118 is used.

Note that the insulator 245 may have a stacked-layer structure like the second gate insulating film. As miniaturization and high integration of transistors progress, a problem such as leakage current might arise because of a thinner gate insulating film. For that reason, when the insulator functioning as a gate insulating film has a stacked-layer structure of a high-k material and a thermally stable material, the potential of a gate at the time when the transistor operates can be lowered while the physical thickness of the gate insulating film is maintained. Furthermore, the stacked-layer structure can be thermally stable and have a high relative permittivity.

The conductor 138 functioning as the first gate is shown to have a two-layer structure in FIG. 8A and FIG. 8B, but may have a single-layer structure or a stacked-layer structure of three or more layers.

For the conductor 138a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 138a has a function of inhibiting diffusion of oxygen, a reduction in conductivity of the conductor 138b due to oxidation caused by oxygen contained in the insulator 245 can be inhibited. As a conductive material having a function of inhibiting diffusion of oxygen, for example, tantalum, tantalum nitride, ruthenium, ruthenium oxide, or the like is preferably used. Moreover, for the conductor 138a, an oxide semiconductor that can be used as the metal oxide 230 can be used. In that case, when the conductor 138b is deposited by a sputtering method, the conductor 138a can have a reduced electrical resistance to be a conductor. Such a conductor can be referred to as an OC (Oxide Conductor) electrode.

Moreover, a conductive material containing tungsten, copper, or aluminum as its main component is preferably used for the conductor 138b. The conductor 138b also functions as a wiring and thus is preferably a conductor having high conductivity. For example, a conductive material containing tungsten, copper, or aluminum as its main component can be used. The conductor 138b may have a stacked-layer structure, for example, a stacked-layer structure of titanium or titanium nitride and any of the above conductive materials.

The insulator 120 is provided over the conductors 132 with the insulator 118 therebetween. The insulator 120 preferably includes an excess-oxygen region. For example, the insulator 120 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable because they are thermally stable. Silicon oxide and porous silicon oxide are particularly preferable because an excess-oxygen region can be easily formed in a later step.

The insulator 120 preferably includes an excess-oxygen region. When the insulator 120 that releases oxygen by heating is provided, oxygen in the insulator 120 can be efficiently supplied to the metal oxide 230. The concentration of impurities such as water or hydrogen in the insulator 120 is preferably low.

The opening in the insulator 120 is formed to overlap the region between the two conductors 132. Thus, the conductor 138 is formed to be embedded in the opening of the insulator 120 and the region between the two conductors 132.

For miniaturization of the communication device, the gate length of the transistor 200 needs to be short; meanwhile, it is necessary to prevent a reduction in conductivity of the conductor 138. An example of a method for preventing a reduction in conductivity of the conductor 138 while reducing the gate length of the transistor 200 is a method of increasing the thickness of the conductor 138. When the thickness of the conductor 138 is increased, the conductor 138 might have a shape with a high aspect ratio. In this embodiment, the conductor 138 is provided to be embedded in the opening of the insulator 120; hence, even when the conductor 138 has a shape with a high aspect ratio, the conductor 138 can be formed without collapsing during the process.

The insulator 122 is preferably provided in contact with the top surface of the insulator 120, the top surface of the conductor 138, and the top surface of the insulator 245. When the insulator 122 is deposited by a sputtering method, excess-oxygen regions can be provided in the insulator 245 and the insulator 120. Accordingly, oxygen can be supplied from the excess-oxygen regions to the metal oxide 230.

For example, a metal oxide containing one kind or two or more kinds selected from hafnium, aluminum, gallium, yttrium, zirconium, tungsten, titanium, tantalum, nickel, germanium, magnesium, and the like can be used as the insulator 122.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 124 functioning as an interlayer film is preferably provided over the insulator 122. As in the insulator 116 and the like, the concentration of impurities such as water or hydrogen in the insulator 124 is preferably reduced.

As illustrated in FIG. 8A, conductors 134 are provided in openings that are formed in the insulator 124, the insulator 122, the insulator 120, and the insulator 118 and reach the conductors 132.

FIG. 7A shows a conductor 134a, a conductor 134b, a conductor 134c, a conductor 134d, and a conductor 134e as the conductors 134. The conductor 134a is provided over the conductor 132a, the conductor 134b is provided over the conductor 132b, the conductor 134c is provided over the conductor 132c, the conductor 134d is provided over the conductor 132d, and the conductor 134e is provided over the conductor 132e.

The conductors 134 have a function of a plug or a wiring. For the conductors 134, a material similar to that for the conductor 130 can be used.

As illustrated in FIG. 7A, a conductor 136a may be provided over the conductor 134a, a conductor 136b may be provided over the conductor 134b, a conductor 136c may be provided over the conductor 134c, a conductor 136d may be provided over the conductor 134d, and a conductor 136e may be provided over the conductor 134e. The conductor 136a to the conductor 136e have a function of a plug or a wiring.

Here, the reference potential is supplied to the conductor 136a and the conductor 136e. The conductor 136b is electrically connected to the transmission terminal Tx, the conductor 136c is electrically connected to the antenna terminal ANT, and the conductor 136d is electrically connected to the reception terminal Rx. From the above, it can be said that the reference potential is supplied to the conductor 132a and the conductor 132e. It can also be said that the conductor 132b is electrically connected to the transmission terminal Tx through the conductor 134b and the conductor 136b, the conductor 132c is electrically connected to the antenna terminal ANT through the conductor 134c and the conductor 136c, and the conductor 132d is electrically connected to the reception terminal Rx through the conductor 134d and the conductor 136d.

For the conductor 136a to the conductor 136e, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 136a to the conductor 136e are shown to have a single-layer structure in this embodiment, but may have a stacked-layer structure of two or more layers without limitation to the single-layer structure. For example, between a conductor having a barrier property and a conductor having high conductivity, a conductor that is highly adhesive to the conductor having a barrier property and the conductor having high conductivity may be formed.

An insulator 126 is provided over the insulator 124 and the conductor 136a to the conductor 136e. The insulator 126 is formed using, for example, silicon oxide, silicon oxynitride, silicon nitride oxide, silicon nitride, aluminum oxide, aluminum oxynitride, aluminum nitride oxide, or aluminum nitride. The insulator 126 may function as a planarization film that covers uneven shapes thereunder.

Next, the function and the like of the conductor 130 will be described. The conductor 130 is provided to include regions overlapped by the conductor 132b, the conductor 132c, and the conductor 132d.

The conductor 130 is provided to include regions overlapped by the conductor 132b, the conductor 132c, the conductor 132d, and the like; accordingly, as illustrated in FIG. 7B1, a capacitor 140 is formed in which the insulator 106, the insulator 108, the insulator 110, the insulator 112, the insulator 114, and the insulator 116 serve as a dielectric and the dielectric is positioned between the conductor 130 and the conductor 132. Here, one terminal of an AC power source 142 illustrated in FIG. 7B1 is electrically connected to the conductor 132. As described above, the potential of the conductor 130 can be the reference potential such as a ground potential. Thus, it can be said that the other terminal of the AC power source 142 is electrically connected to the conductor 130. Note that FIG. 7B2 is a circuit diagram in which the capacitor 140 is replaced with a circuit symbol.

In the case where the conductor 132 is the conductor 132b, the AC power source 142 can be, for example, an AC power source having a function of generating the signal 30, which the wireless transceiver 10 transmits to the outside of the wireless transceiver 10. In the case where the conductor 132 is the conductor 132c, the AC power source 142 can be, for example, an AC power source having a function of generating the signal 40, which the wireless transceiver 10 receives from the outside of the wireless transceiver 10. In the case where the conductor 132 is the conductor 132d, the AC power source 142 can be, for example, an AC power source having a function of transmitting the signal 40 to a device electrically connected to the reception terminal Rx.

Note that the conductor 132 and the one terminal of the AC power source 142 are not necessarily connected physically to each other by a wiring or the like. The conductor 130 and the other terminal of the AC power source 142 are not necessarily connected physically to each other by a wiring or the like. A signal and the like generated by the AC power source 142 are transmitted by radio waves, for example. Thus, even when the conductor 132 and the AC power source 142 are not physically connected to each other, the conductor 132 and the AC power source 142 can be regarded as being electrically connected to each other.

Next, the case where the duplexer 20 does not include the conductor 130 is considered. Note that the insulator 102 and the insulator 104 are also not included. In that case, as illustrated in FIG. 7B3, a capacitor 144 is formed in which the insulator 106, the insulator 108, the insulator 110, the insulator 112, the insulator 114, and the insulator 116 serve as a dielectric and the dielectric is positioned between the substrate 100 and the conductor 132.

Figure 4A:
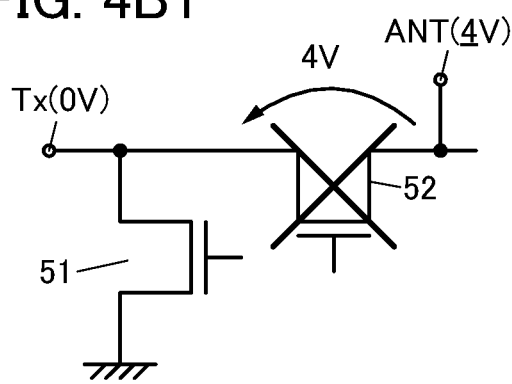
Figure 4A:
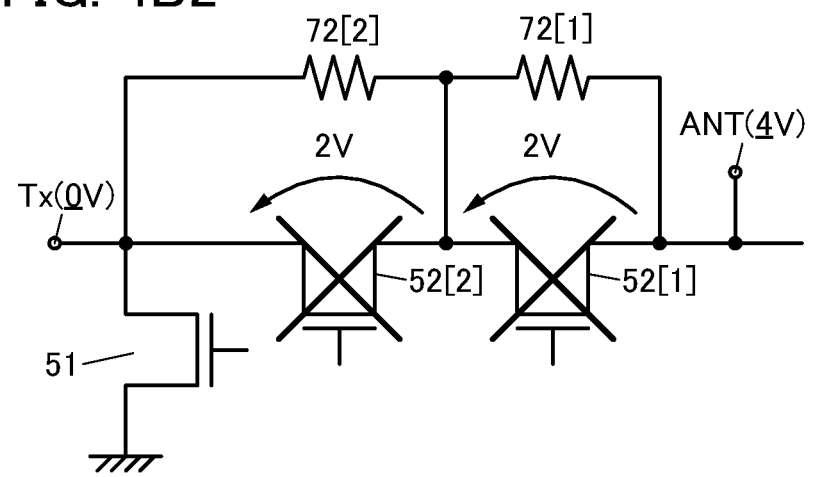

FIG. 7B4 is a circuit diagram in which the capacitor 144 is replaced with a circuit symbol. When the substrate 100 is, for example, a silicon substrate or a semiconductor substrate, the electrical resistance of the substrate 100 is higher than the electrical resistance of the conductor 130. Thus, the capacitor 144 is considered to have a structure where a resistor 141 is electrically connected in series with a capacitor 140a. Here, the resistor 141 can represent a difference between the electric resistance of the substrate 100 illustrated in FIG. 7B3 and the electric resistance of the conductor 130 illustrated in FIG. 7B1.

From the above, a variation in the potential generated by the AC power source 142 due to electric resistance can be suppressed more in the case where the duplexer 20 includes the conductor 130 than in the case where the duplexer 20 does not include the conductor 130. Thus, the wireless transceiver 10 can transmit and receive signals with high accuracy.

Figure 9A:
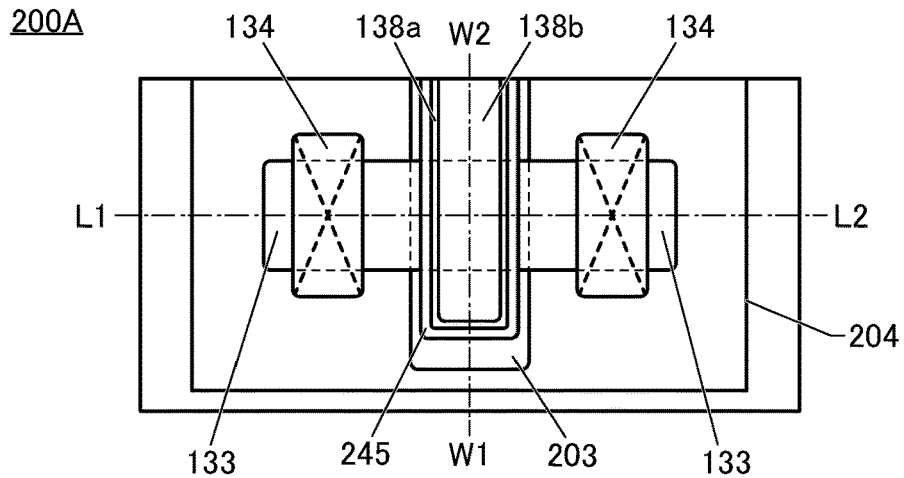
FIG. 9A is a top view illustrating a structure example of a transistor.
Figure 9B:
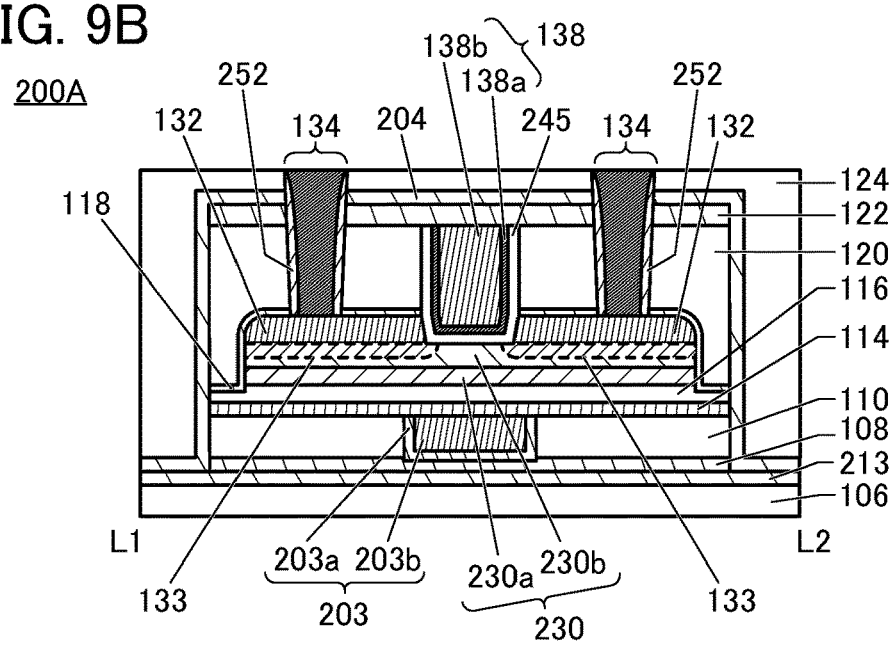
FIG. 9B and FIG. 9C are cross-sectional views illustrating the structure example of the transistor.
Figure 9C:
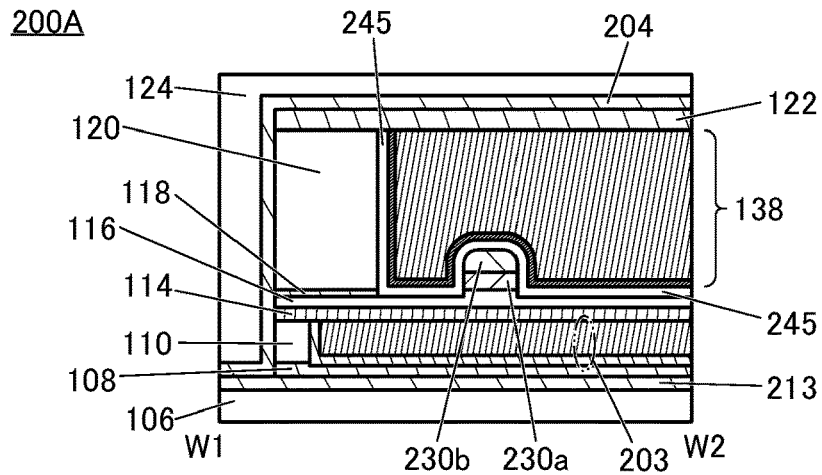

A transistor 200A illustrated in FIG. 9A, FIG. 9B, and FIG. 9C is a modification example of the transistor 200 having the structure illustrated in FIG. 8A and FIG. 8B. FIG. 9A is a top view of a transistor 200A, FIG. 9B is a cross-sectional view of the transistor 200A in the channel length direction, and FIG. 9C is a cross-sectional view of the transistor 200A in the channel width direction. Note that for clarity of the drawing, some components are not shown in the top view of FIG. 9A.

The transistor 200A having the structure illustrated in FIG. 9A, FIG. 9B, and FIG. 9C is different from the transistor 200 having the structure illustrated in FIG. 8A and FIG. 8B in that an insulator 252, an insulator 213, and an insulator 204 are included. The transistor 200A is also different from the transistor 200 having the structure illustrated in FIG. 8A and FIG. 8B in that the insulator 252 is provided in contact with the side surface of the conductor 134. Moreover, the transistor 200A is different from the transistor 200 having the structure illustrated in FIG. 8A and FIG. 8B in that the insulator 112 is not included.

In the transistor 200A having the structure illustrated in FIG. 9A, FIG. 9B, and FIG. 9C, the insulator 213 is provided over the insulator 106. The insulator 204 is provided over the insulator 122 and the insulator 213.

In the transistor 200A having the structure illustrated in FIG. 9A, FIG. 9B, and FIG. 9C, the insulator 108, the insulator 110, the insulator 114, the insulator 116, the insulator 118, the insulator 120, and the insulator 122 are patterned, and the insulator 204 covers them. That is, the insulator 204 is in contact with the top surface of the insulator 122, the side surface of the insulator 122, the side surface of the insulator 120, the side surface of the insulator 118, the side surface of the insulator 116, the side surface of the insulator 114, the side surface of the insulator 110, the side surface of the insulator 108, and the top surface of the insulator 213. Thus, the metal oxide 230 and the like are isolated from the outside by the insulator 204 and the insulator 213.

The insulator 213 and the insulator 204 preferably have high capability of inhibiting diffusion of hydrogen (e.g., at least one of a hydrogen atom, a hydrogen molecule, and the like) or a water molecule. For example, for the insulator 213 and the insulator 204, silicon nitride or silicon nitride oxide, which is a material having a high hydrogen barrier property, is preferably used. This can inhibit diffusion of hydrogen or the like into the metal oxide 230, thereby suppressing the degradation of the characteristics of the transistor 200A. Consequently, the reliability of the communication device of one embodiment of the present invention can be increased.

The insulator 252 is provided in contact with the insulator 124, the insulator 204, the insulator 122, the insulator 120, and the insulator 118. The insulator 252 preferably has a function of inhibiting diffusion of hydrogen or water molecules. For example, for the insulator 252, an insulator such as silicon nitride, aluminum oxide, or silicon nitride oxide, which is a material having a high hydrogen barrier property, is preferably used. In particular, silicon nitride is suitably used for the insulator 252 because of its high hydrogen barrier property. The use of a material having a high hydrogen barrier property for the insulator 252 can inhibit diffusion of impurities such as water or hydrogen from the insulator 120 and the like into the metal oxide 230 through the conductor 134. Furthermore, oxygen contained in the insulator 120 can be inhibited from being absorbed by the conductor 134. Accordingly, the reliability of the communication device of one embodiment of the present invention can be increased.

Figure 10A:
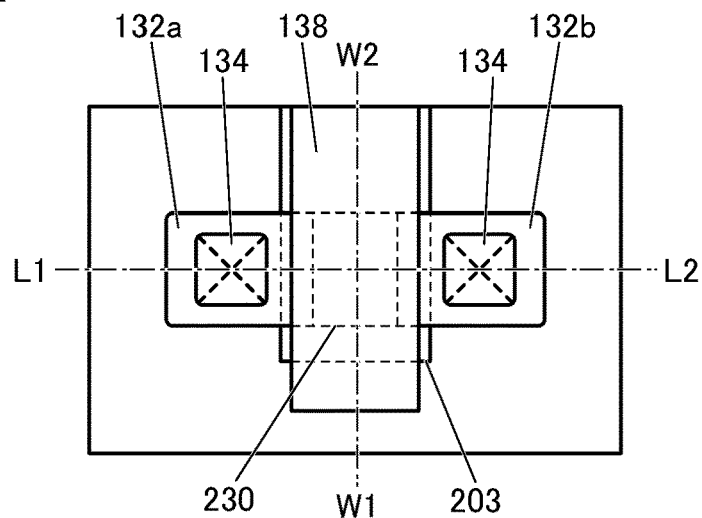
FIG. 10A is a top view illustrating a structure example of a transistor.
Figure 10B:
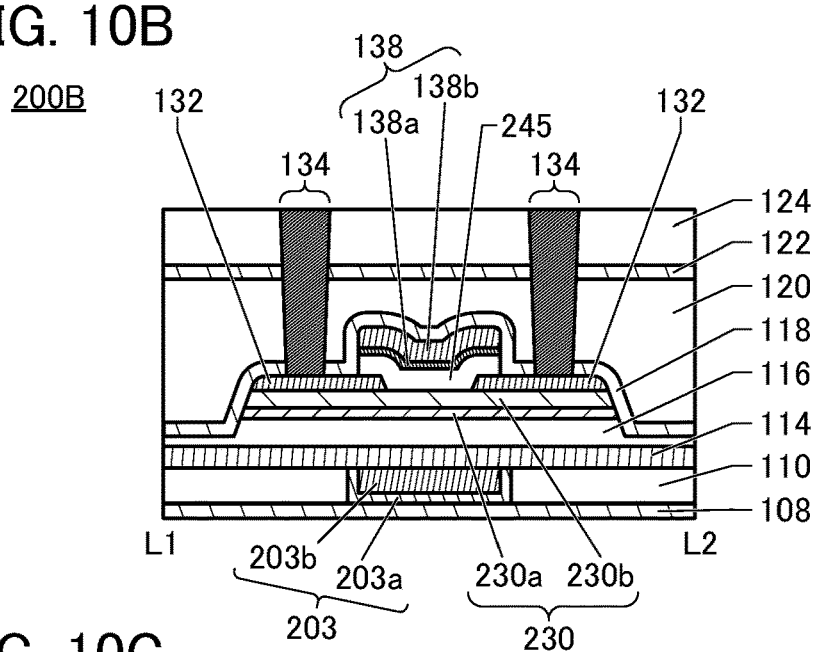
FIG. 10B and FIG. 10C are cross-sectional views illustrating the structure example of the transistor.
Figure 10C:
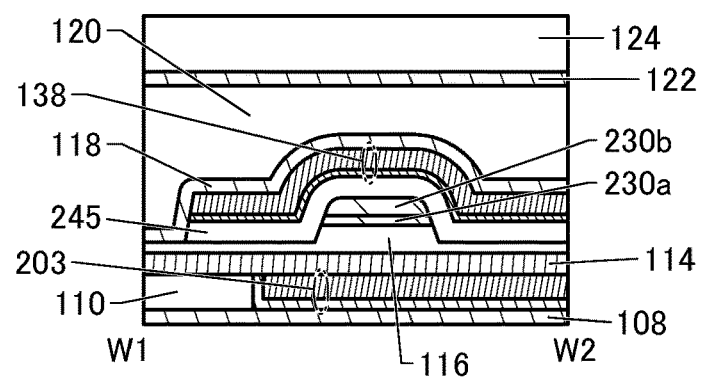

A structure example of a transistor 200B is described with reference to FIG. 10A, FIG. 10B, and FIG. 10C. FIG. 10A is a top view of the transistor 200B. FIG. 10B is a cross-sectional view of a portion indicated by the dashed-dotted line L1-L2 in FIG. 10A. FIG. 10C is a cross-sectional view of a portion indicated by the dashed-dotted line W1-W2 in FIG. 10A. Note that for clarity of the drawing, some components are not shown in the top view of FIG. 10A.

The transistor 200B is a modification example of the transistor 200 and can be replaced with the transistor 200. Thus, differences of the transistor 200B from the transistor 200 will be mainly described to avoid repeated description.

The conductor 138 functioning as a first gate includes the conductor 138a and the conductor 138b over the conductor 138a. For the conductor 138a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 138a has a function of inhibiting oxygen diffusion, the range of choices for the material of the conductor 138b can be expanded. That is, the conductor 138a inhibits oxidation of the conductor 138b, thereby inhibiting the decrease in conductivity of the conductor 138b.

The insulator 118 is preferably provided to cover the top surface and the side surface of the conductor 138 and the side surface of the insulator 245. For the insulator 118, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 118 can inhibit oxidation of the conductor 138. Moreover, the insulator 118 can inhibit diffusion of impurities such as water and hydrogen contained in the insulator 120 into the transistor 200B.

The transistor 200B has the conductor 138 overlapping part of the conductor 132, and thus tends to have larger parasitic capacitance than the transistor 200. Consequently, the transistor 200B tends to have a lower operating frequency than the transistor 200. Meanwhile, the transistor 200B does not require steps of providing an opening in the insulator 120 and the like and embedding the conductor 138, the insulator 245, and the like in the opening; hence, the productivity of the transistor 200B is higher than that of the transistor 200.

The compositions, structures, methods, and the like described in this embodiment can be used in an appropriate combination with the compositions, structures, methods, and the like described in the other embodiments.

Embodiment 2

In this embodiment, an oxide semiconductor which is a kind of metal oxides will be described.

A metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 11A. FIG. 11A is a diagram showing the classification of crystal structures of an oxide semiconductor, typically IGZO (a metal oxide containing In, Ga, and Zn).

As shown in FIG. 11A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous (excluding single crystal and poly crystal). The term "Crystal" includes single crystal and poly crystal.

Note that the structures in the thick frame in FIG. 11A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 11B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 11B and obtained by GIXD measurement is hereinafter simply referred to as an XRD spectrum. The composition of the CAAC-IGZO film in FIG. 11B is In:Ga:Zn=4:2:3 [atomic ratio] or the neighborhood thereof. The CAAC-IGZO film in FIG. 11B has a thickness of 500 nm.

As shown in FIG. 11B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 11B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (also referred to as a nanobeam electron diffraction pattern). FIG. 11C shows a diffraction pattern of a CAAC-IGZO film. FIG. 11C shows a diffraction pattern obtained with NBED in which an electron beam is incident in the direction parallel to the substrate. The composition of the CAAC-IGZO film in FIG. 11C is In:Ga:Zn=4:2:3 [atomic ratio] or the neighborhood thereof. In the nanobeam electron diffraction method, electron diffraction is performed with a probe diameter of 1 nm.

As shown in FIG. 11C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 11A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC- OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-1}$, still further preferably lower than or equal to $1\times10^{11}$ cm$^{-1}$, yet further preferably lower than $1\times10^{10}$ cm$^{3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to $2\times10^{18}$ atoms/cm$^{3}$, preferably lower than or equal to $2\times10^{17}$ atoms/cm$^{3}$.

When the oxide semiconductor contains an alkali metal or an alkaline earth metal, defect states are formed and carriers are generated in some cases. Hence, a transistor using an oxide semiconductor that contains an alkali metal or an alkaline earth metal is likely to have normally on characteristics. Thus, the concentration of an alkali metal or an alkaline earth metal in the oxide semiconductor, which is obtained by SIMS, is lower than or equal to $1\times10^{18}$ atoms/cm$^{3}$, preferably lower than or equal to $2\times10^{16}$ atoms/cm$^{3}$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$.

When an oxide semiconductor with sufficiently reduced impurities is used for the channel formation region of the transistor, stable electrical characteristics can be given.

The compositions, structures, methods, and the like described in this embodiment can be used in an appropriate combination with the compositions, structures, methods, and the like described in the other embodiments.

Embodiment 3

In this embodiment, application examples of the above-described communication device will be described.

[Semiconductor Wafer and Chip]

Figure 12A:
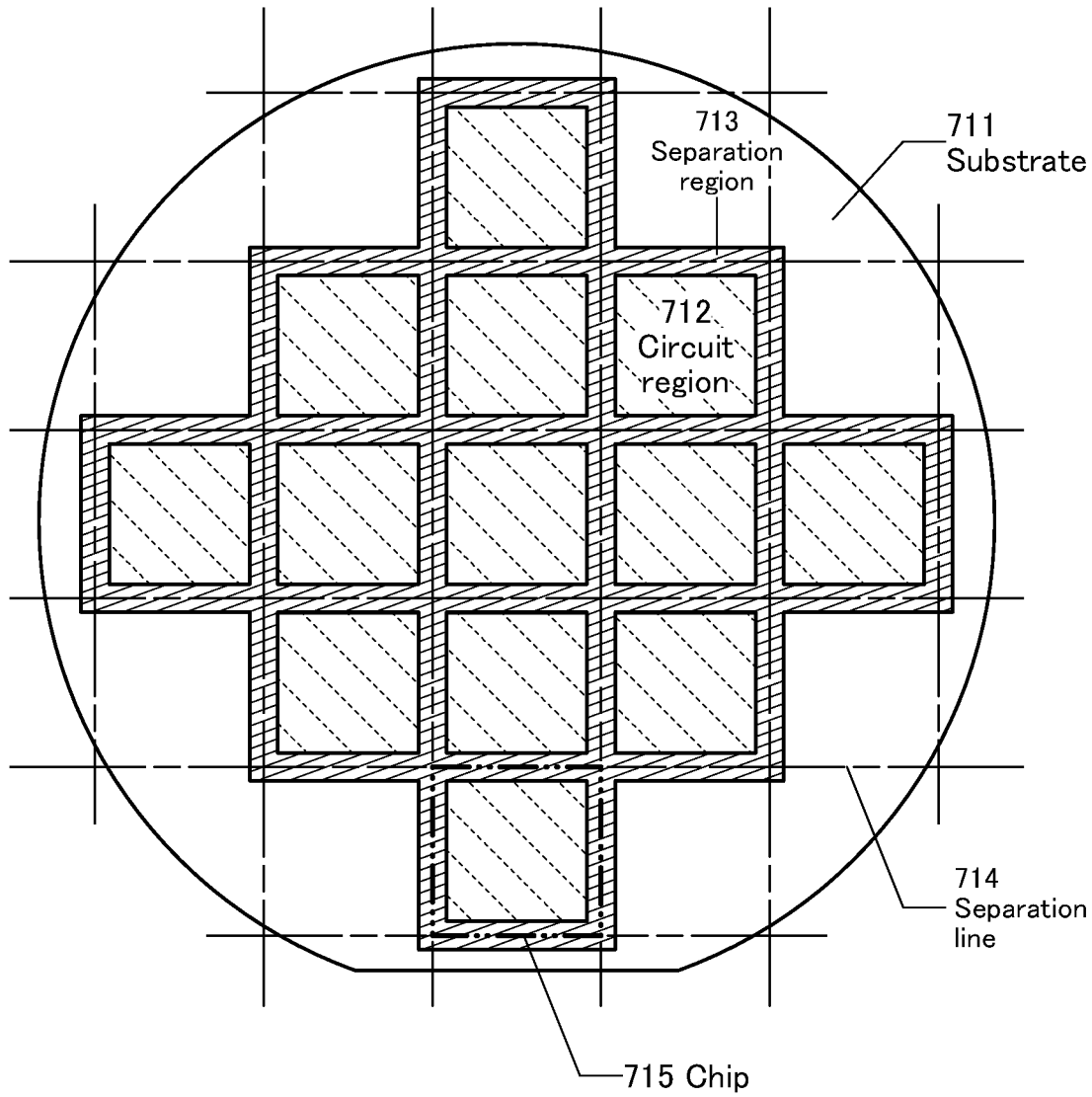
FIG. 12A is a top view of a semiconductor wafer.

FIG. 12A is a top view of a substrate 711 before dicing treatment is performed. As the substrate 711, a semiconductor substrate (also referred to as a "semiconductor wafer") can be used, for example. A plurality of circuit regions 712 are provided on the substrate 711. The communication device of one embodiment of the present invention, a CPU, an RF tag, an image sensor, or the like can be provided in the circuit region 712.

Figure 12B:
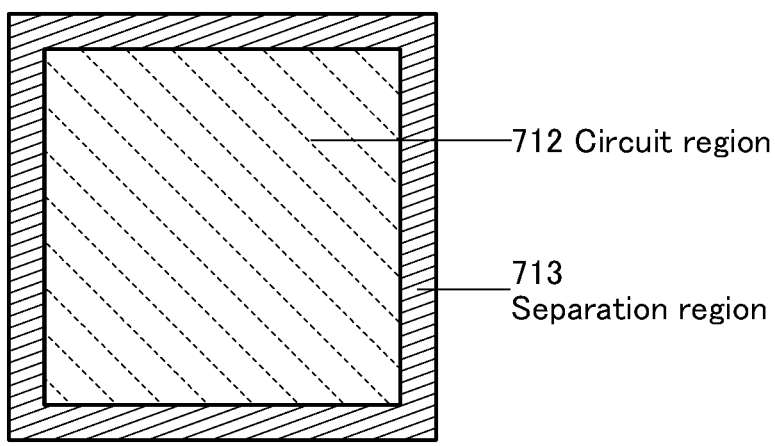
FIG. 12B is a top view of a chip.

The plurality of circuit regions 712 are each surrounded by a separation region 713. Separation lines (also referred to as "dicing lines") 714 are set at a position overlapping the separation regions 713. The substrate 711 is cut along the separation lines 714, whereby chips 715 including the circuit regions 712 can be cut out from the substrate 711. FIG. 12B is an enlarged view of the chip 715.

A conductor or a semiconductor may be provided in the separation regions 713. Providing a conductor or a semiconductor in the separation regions 713 relieves ESD that might be caused in a dicing step, thereby inhibiting a decrease in the yield in the dicing step. Furthermore, a dicing step is generally performed while letting pure water whose specific resistance is decreased by dissolution of a carbonic acid gas or the like flow to a cut portion in order to cool down a substrate, remove swarf, and prevent electrification, for example. Providing a conductor or a semiconductor in the separation regions 713 allows a reduction in the usage of the pure water. Therefore, the manufacturing cost of the communication device can be reduced. Moreover, the productivity of the communication device can be increased.

For a semiconductor provided in the separation regions 713, it is preferable to use a material having a band gap greater than or equal to 2.5 eV and less than or equal to 4.2 eV, preferably greater than or equal to 2.7 eV and less than or equal to 3.5 eV. The use of such a material allows accumulated charge to be released slowly; thus, rapid move of charge due to ESD can be suppressed and electrostatic breakdown is less likely to occur.

[Electronic Component]

Figure 13A:
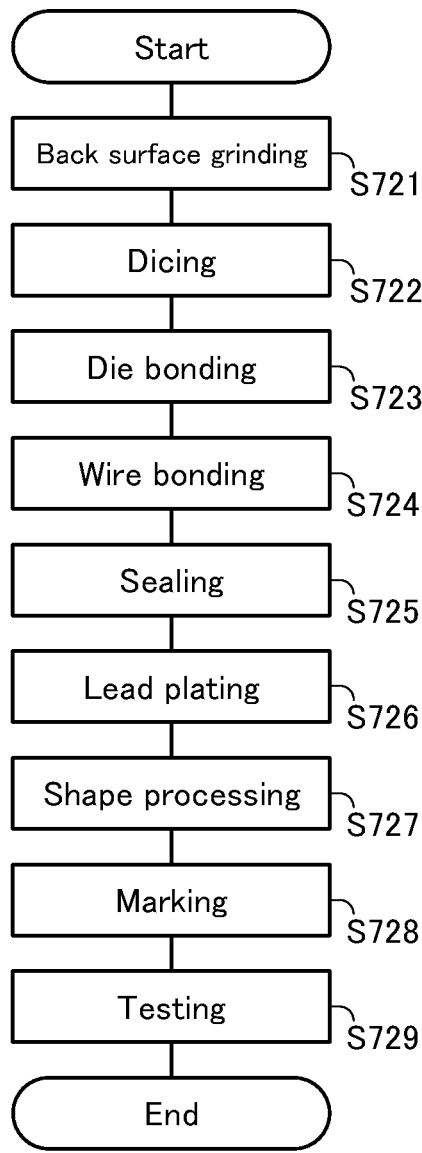
FIG. 13A is a flow chart showing an example of a process for manufacturing an electronic component.

An example where the chip 715 is used in an electronic component will be described with reference to FIG. 13A and FIG. 13B. Note that the electronic component is also referred to as a semiconductor package or an IC package. For electronic components, there are various standards and names corresponding to a terminal extraction direction and a terminal shape.

The electronic component is completed when the communication device described in the above embodiment is combined with components other than the communication device in an assembly process (post-process).

The post-process is described with reference to a flow chart of FIG. 13A. After an element substrate including the communication device described in the above embodiment is completed in a pre-process, a "back surface grinding step" is performed to grind a back surface (a surface where the communication device and the like are not formed) of the element substrate (Step S721). When the element substrate is thinned by grinding, warpage or the like of the element substrate is reduced, resulting in the reduction in size of the electronic component.

Next, a "dicing step" for dividing the element substrate into a plurality of chips (chips 715) is performed (Step S722). Then, a "die bonding step" for individually bonding the divided chips to a lead frame is performed (Step S723). To bond a chip and a lead frame in the die bonding step, resin bonding, tape-automated bonding, or the like is selected as determined as appropriate by products. Note that the chip may be bonded to an interposer substrate instead of the lead frame.

Next, a "wire bonding step" for electrically connecting a lead of the lead frame and an electrode on the chip through a metal fine line (wire) is performed (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" for plating the lead of the lead frame is performed (Step S726). The plating treatment inhibits rust of the lead, and soldering at the time of mounting the electronic component on a printed board in a later step can be performed with higher reliability. Then, a "shape processing step" for cutting and processing the lead into a given shape is performed (Step S727).

Next, a "marking step" for printing (marking) a surface of the package is performed (Step S728). Then, after a "testing step" (Step S729) for checking whether an external shape is good and whether there is malfunction, for example, the electronic component is completed.

Figure 13B:
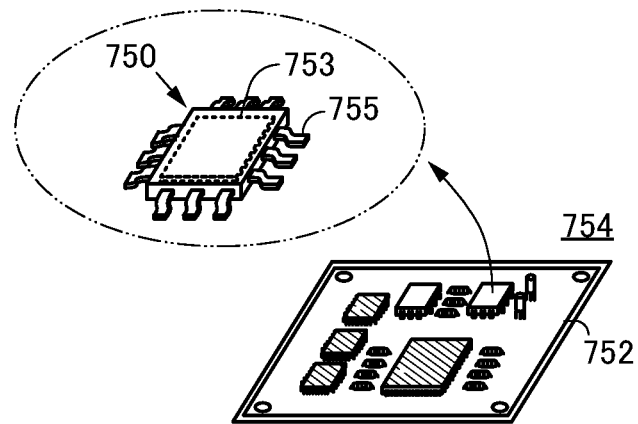
FIG. 13B is a schematic perspective view of an electronic component.

FIG. 13B is a schematic perspective view of the completed electronic component. FIG. 13B shows a schematic perspective view of a QFP (Quad Flat Package) as an example of the electronic component. An electronic component 750 illustrated in FIG. 13B includes a lead 755 and a communication device 753. As the communication device 753, the communication device described in the above embodiment or the like can be used.

The electronic component 750 illustrated in FIG. 13B is mounted on a printed circuit board 752, for example. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Devices]

Next, examples of electronic devices including the communication device of one embodiment of the present invention or the above-described electronic component will be described with reference to FIG. 14.

Examples of electronic devices using the communication device or the electronic component of one embodiment of the present invention include display devices of televisions, monitors, and the like, lighting devices, desktop or laptop personal computers, word processors, image reproduction devices that reproduce still images or moving images stored in recording media such as DVDs (Digital Versatile Discs), portable CD players, radios, tape recorders, headphone stereos, stereos, table clocks, wall clocks, cordless phone handsets, transceivers, mobile phones, car phones, portable game machines, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid.

Moving objects driven by electric motors using power from power storage devices are also included in the category of electronic devices. Examples of the moving objects include electric vehicles (EVs), hybrid electric vehicles (HEVs) which include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats and ships, submarines, helicopters, aircraft, rockets, artificial satellites, space probes, planetary probes, and spacecraft.

The communication device or the electronic component of one embodiment of the present invention can be used for communication devices or the like included in these electronic devices. When the electronic device includes the communication device or the electronic component of one embodiment of the present invention, the electronic device can perform wireless communication in a high-frequency band. Thus, the electronic device can be compatible with the 5G communication standards, for example.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium.

Figure 14:
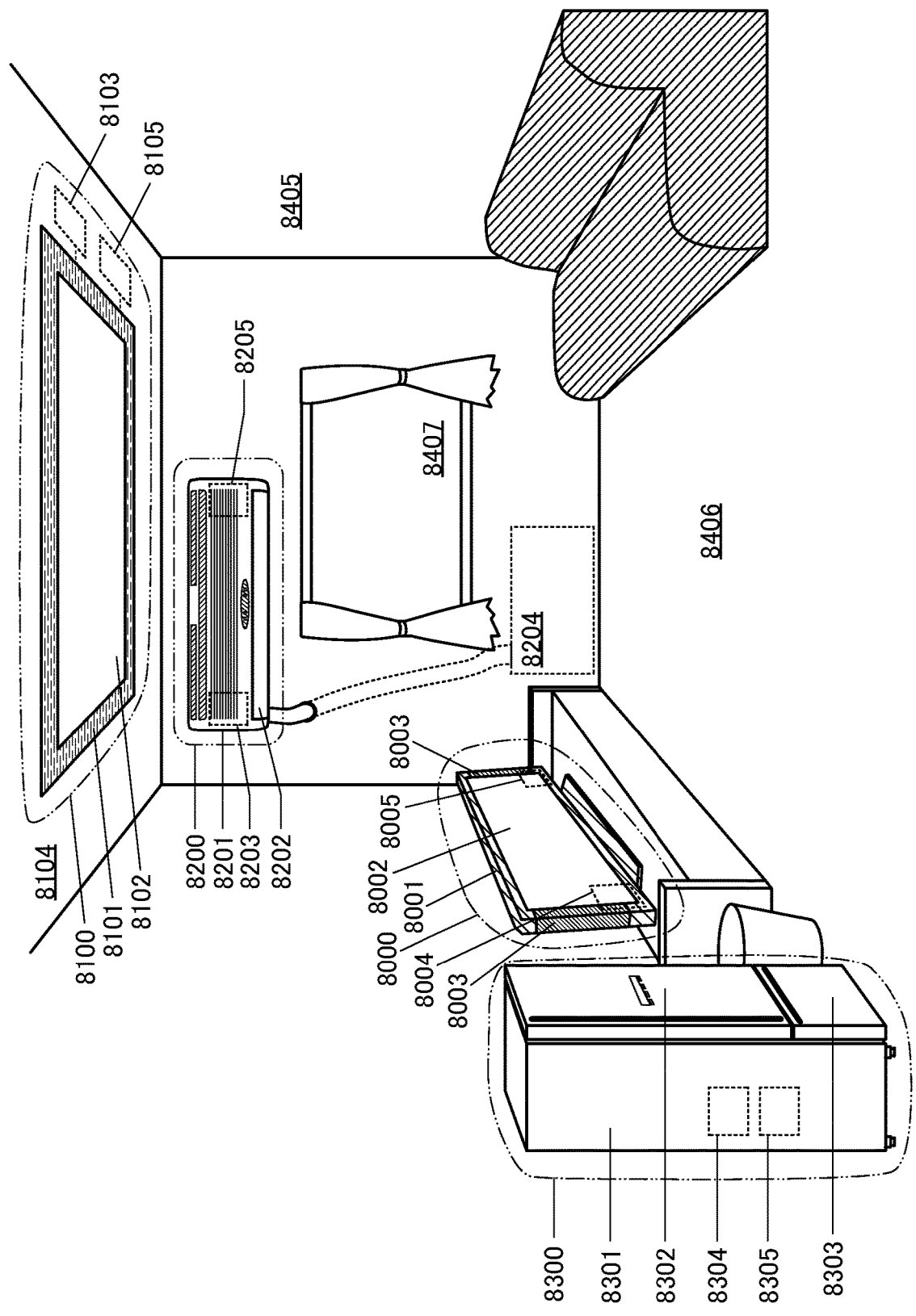
FIG. 14 is a diagram illustrating examples of electronic devices.

FIG. 14 and FIG. 15A to FIG. 15F illustrate examples of electronic devices. In FIG. 14, a display device 8000 is an example of an electronic device using a communication device 8004 of one embodiment of the present invention. Specifically, the display device 8000 corresponds to a display device for TV broadcast reception and includes a housing 8001, a display portion 8002, speaker portions 8003, the communication device 8004, a power storage device 8005, and the like. The communication device 8004 of one embodiment of the present invention is provided in the housing 8001. The communication device 8004 can retain control data, a control program, and the like. The communication device 8004 has a communication function and allows the display device 8000 to function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoretic display device, a DMD (Digital Micromirror Device), a PDP (Plasma Display Panel), or an FED (Field Emission Display) can be used for the display portion 8002.

Note that the display device includes, in its category, all of information display devices for personal computers, advertisement display, and the like besides for TV broadcast reception.

In FIG. 14, an installation lighting device 8100 is an example of an electronic device using a communication device 8103 of one embodiment of the present invention. Specifically, the lighting device 8100 includes a housing 8101, a light source 8102, the communication device 8103, a power storage device 8105, and the like. Although the case where the communication device 8103 is provided in a ceiling 8104 on which the housing 8101 and the light source 8102 are installed is illustrated in FIG. 14 as an example, the communication device 8103 may alternatively be provided in the housing 8101. The communication device 8103 can retain data such as emission luminance of the light source 8102, a control program, and the like. The communication device 8103 has a communication function and allows the lighting device 8100 to function as an IoT device. The lighting device 8100 can receive electric power from a commercial power supply. Alternatively, the lighting device 8100 can use electric power stored in the power storage device.

Note that although the installation lighting device 8100 provided in the ceiling 8104 is illustrated in FIG. 14 as an example, the communication device of one embodiment of the present invention can be used in an installation lighting device provided in, for example, a wall 8405, a floor 8406, a window 8407, or the like other than the ceiling 8104, and can also be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 14, an air conditioner including an indoor unit 8200 and an outdoor unit 8204 is an example of an electronic device using a communication device 8203 of one embodiment of the present invention. Specifically, the indoor unit 8200 includes a housing 8201, an air outlet 8202, the communication device 8203, a power storage device 8205, and the like. Although the case where the communication device 8203 is provided in the indoor unit 8200 is illustrated in FIG. 14 as an example, the communication device 8203 may be provided in the outdoor unit 8204. Alternatively, the communication devices 8203 may be provided in both the indoor unit 8200 and the outdoor unit 8204. The communication device 8203 can retain control data, a control program, and the like for the air conditioner. The communication device 8203 has a communication function and allows the air conditioner to function as an IoT device. The air conditioner can receive electric power from a commercial power supply. Alternatively, the air conditioner can use electric power stored in the power storage device 8205.

Note that although the split-type air conditioner including the indoor unit and the outdoor unit is illustrated in FIG. 14 as an example, the communication device of one embodiment of the present invention can also be used in an air conditioner in which one housing has the function of an indoor unit and the function of an outdoor unit.

In FIG. 14, an electric refrigerator-freezer 8300 is an example of an electronic device using a communication device 8304 of one embodiment of the present invention. Specifically, the electric refrigerator-freezer 8300 includes a housing 8301, a refrigerator door 8302, a freezer door 8303, the communication device 8304, a power storage device 8305, and the like. The power storage device 8305 is provided in the housing 8301 in FIG. 14. The communication device 8304 can retain control data, a control program, and the like for the electric refrigerator-freezer 8300. The communication device 8304 has a communication function and allows the electric refrigerator-freezer 8300 to function as an IoT device. The electric refrigerator-freezer 8300 can receive electric power from a commercial power supply. Alternatively, the electric refrigerator-freezer 8300 can use electric power stored in the power storage device 8305.

Figure 15A:
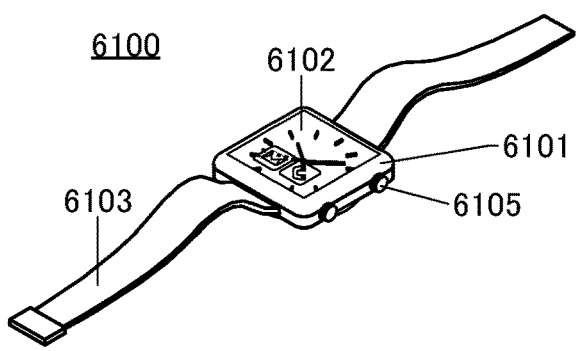
FIG. 15A to FIG. 15F are diagrams illustrating examples of electronic devices.

FIG. 15A illustrates an example of a wrist-watch-type portable information terminal. A portable information terminal 6100 includes a housing 6101, a display portion 6102, a band 6103, operation buttons 6105, and the like. Moreover, the portable information terminal 6100 internally includes a secondary battery and the communication device or the electronic component of one embodiment of the present invention. Using the communication device or the electronic component of one embodiment of the present invention in the portable information terminal 6100 enables the portable information terminal 6100 to function as an IoT device.

Figure 15B:
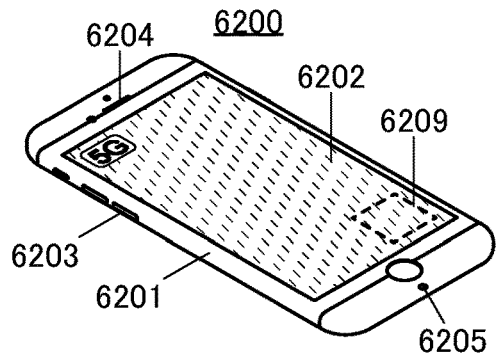

FIG. 15B illustrates an example of a mobile phone. A portable information terminal 6200 includes a display portion 6202 incorporated in a housing 6201, operation buttons 6203, a speaker 6204, a microphone 6205, and the like.

The portable information terminal 6200 also includes a fingerprint sensor 6209 in a region overlapping the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 internally includes a secondary battery and the communication device or the electronic component of one embodiment of the present invention. Using the communication device or the electronic component of one embodiment of the present invention in the portable information terminal 6200 enables the portable information terminal 6200 to function as an IoT device.

Figure 15C:
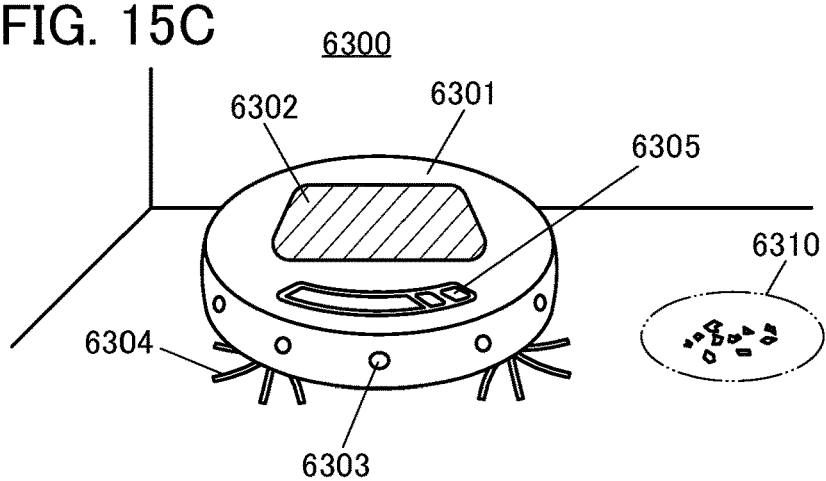

FIG. 15C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 internally includes a secondary battery and the communication device or the electronic component of one embodiment of the present invention. Using the communication device or the electronic component of one embodiment of the present invention in the cleaning robot 6300 enables the cleaning robot 6300 to function as an IoT device.

Figure 15D:
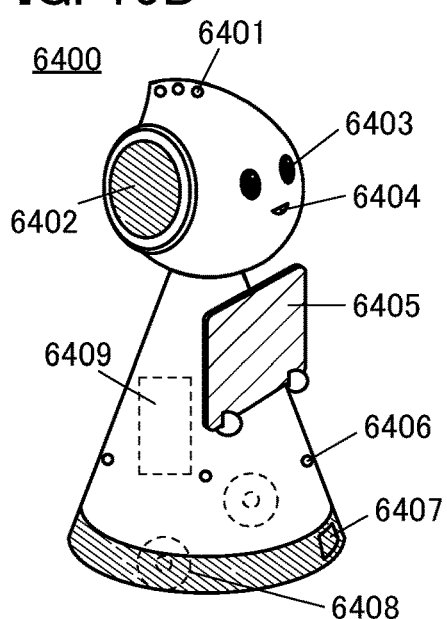

FIG. 15D illustrates an example of a robot. A robot 6400 illustrated in FIG. 15D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of the user, an environmental sound, and the like. The speaker 6404 also has a function of outputting sound. The robot 6400 can communicate with the user with the use of the microphone 6402 and the speaker 6404.

The display portion 6405 has a function of displaying various kinds of information. The robot 6400 can display information desired by the user on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect the presence of an obstacle in the direction where the robot 6400 advances with the moving mechanism 6408. The robot 6400 can move safely by recognizing the surroundings with the upper camera 6403, the lower camera 6406, and the obstacle sensor 6407.

The robot 6400 internally includes a secondary battery and the communication device or the electronic component of one embodiment of the present invention. Using the communication device or the electronic component of one embodiment of the present invention in the robot 6400 enables the robot 6400 to function as an IoT device.

Figure 15E:
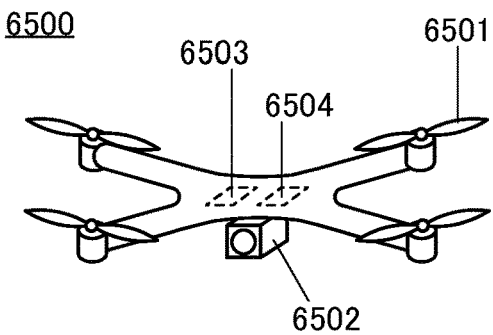

FIG. 15E illustrates an example of a flying object. A flying object 6500 illustrated in FIG. 15E includes propellers 6501, a camera 6502, a battery 6503, an electronic component 6504, and the like and has a function of flying autonomously.

For example, image data taken by the camera 6502 is stored in the electronic component 6504. The electronic component 6504 can analyze the image data to sense whether there is an obstacle in the way of movement, for example. Moreover, the electronic component 6504 can estimate the remaining battery level from a change in the power storage capacity of the battery 6503. The flying object 6500 internally includes the communication device or the electronic component of one embodiment of the present invention. Using the communication device or the electronic component of one embodiment of the present invention in the flying object 6500 enables the flying object 6500 to function as an IoT device.

Figure 15F:
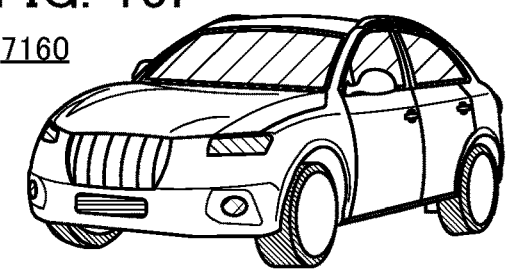

FIG. 15F illustrates an example of an automobile. An automobile 7160 includes an engine, tires, a brake, a steering gear, a camera, and the like. The automobile 7160 internally includes the communication device or the electronic component of one embodiment of the present invention. Using the communication device or the electronic component of one embodiment of the present invention in the automobile 7160 enables the automobile 7160 to function as an IoT device.

The compositions, structures, methods, and the like described in this embodiment can be used in an appropriate combination with the compositions, structures, methods, and the like described in the other embodiments.

Embodiment 4

A normally off CPU (also referred to as a "Noff-CPU") can be achieved using the OS transistor described in this specification and the like. Note that the Noff CPU is an integrated circuit including a normally off transistor, which is in a non-conducting state (also referred to as an off state) even when the gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in the operating speed.

The Noff-CPU can be suitably used for a small-scale system such as an IoT (Internet of Things) end device (also referred to as an "endpoint microcomputer") 803 in the IoT field, for example.

Figure 16:
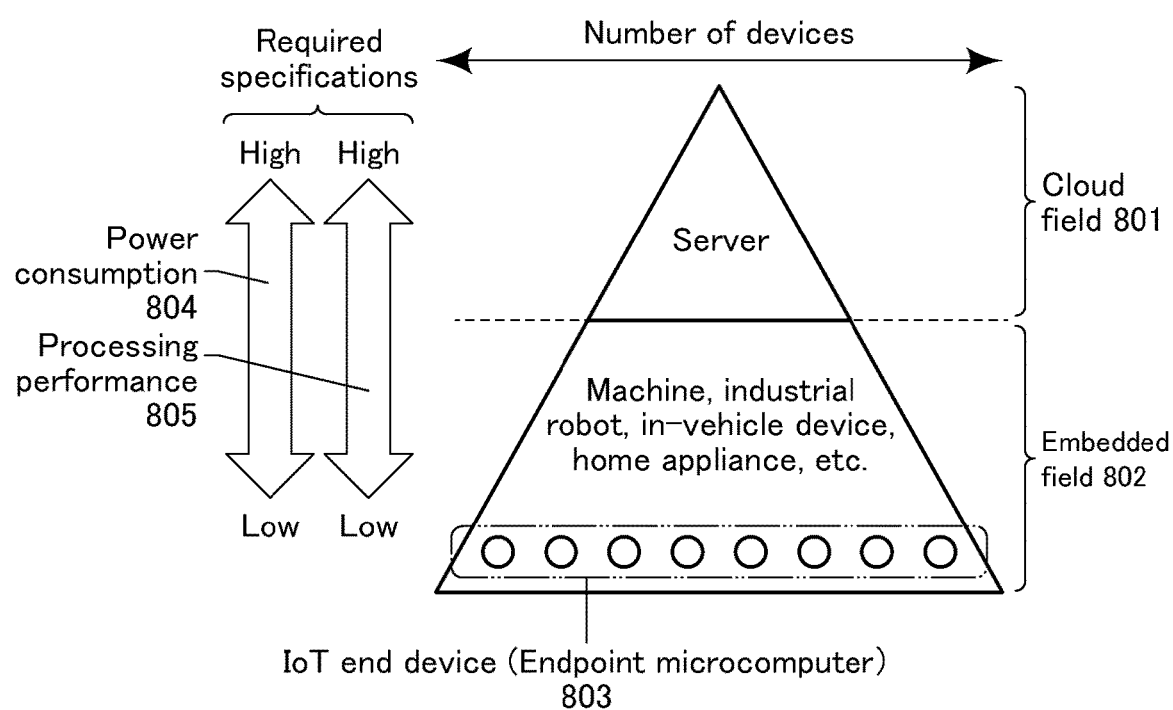
FIG. 16 is a diagram illustrating a hierarchical structure of an IoT network and tendencies of required specifications.

FIG. 16 illustrates a hierarchical structure of an IoT network and tendencies of required specifications. FIG. 16 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The communication device of one embodiment of the present invention can be suitably used for a communication device in the IoT end device that needs to have low power consumption.

Note that an "endpoint" refers to an end region of the embedded field 802. Examples of devices used in the endpoint include microcomputers used in a factory, a home appliance, infrastructure, agriculture, and the like.

Figure 17:
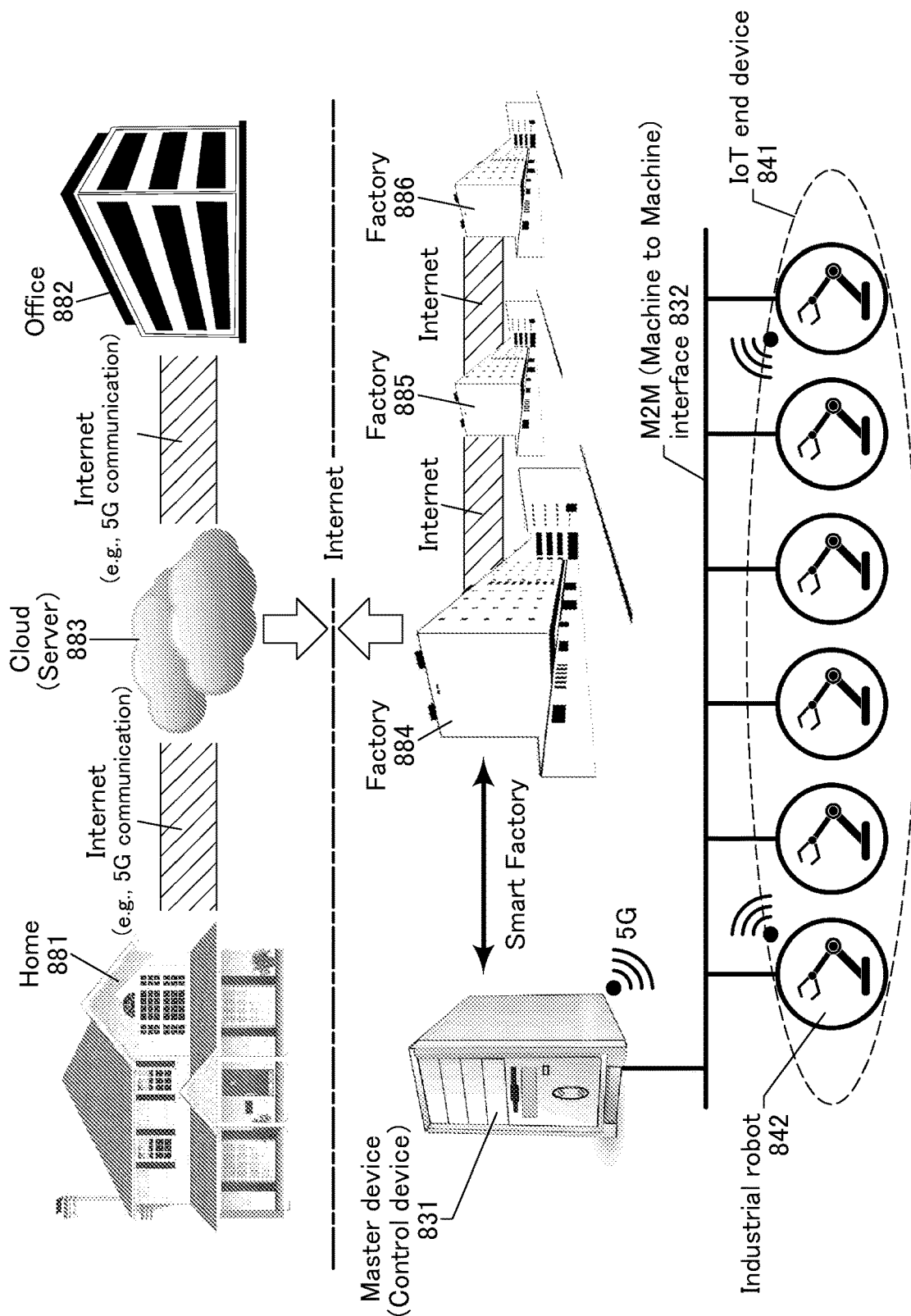
FIG. 17 is a conceptual diagram of factory automation.

FIG. 17 is a conceptual diagram showing factory automation as an application example of the endpoint microcomputer. A factory 884 is connected to a cloud 883 with Internet connection (Internet). The cloud 883 is connected to a home 881 and an office 882 with the Internet connection. The Internet connection may be wired communication or wireless communication. In the case of wireless communication, for example, wireless communication based on a communication standard such as the fourth-generation mobile communications system (4G) or the fifth-generation mobile communications system (5G) is performed using the communication device of one embodiment of the present invention for a communication device. The factory 884 may be connected to a factory 885 and a factory 886 with the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (registered trademark), which is a kind of wired communication, or local 5G, which is a kind of wireless communication, may be used.

A factory manager can check the operational status or the like by connecting to the factory 884 from the home 881 or the office 882 through the cloud 883. In addition, the manager can check wrong items and part shortage, instruct a storage space, and measure takt time, for example.

In recent years, IoT has been globally introduced into factories; under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff-CPU. Meanwhile, the embedded field of IoT sometimes requires quick response; the use of the Noff-CPU achieves high-speed return from a standby state.

The compositions, structures, methods, and the like described in this embodiment can be used in an appropriate combination with the compositions, structures, methods, and the like described in the other embodiments.

REFERENCE NUMERALS

10: wireless transceiver, 11: antenna, 20: duplexer, 21: control circuit, 23: local oscillator, 30: signal, 31: power amplifier, 32: band-pass filter, 33: mixer, 34: band-pass filter, 35: modulator, 36: signal, 40: signal, 41: low-noise amplifier, 42: band-pass filter, 43: mixer, 44: band-pass filter, 45: demodulator, 46: signal, 51: transistor, 52: transistor, 53: resistor, 54: resistor, 55: inductor, 56: inductor, 61: transistor, 62: transistor, 63: resistor, 64: resistor, 65: inductor, 66: inductor, 72: resistor, 100: substrate, 102: insulator, 104: insulator, 106: insulator, 108: insulator, 110: insulator, 112: insulator, 114: insulator, 116: insulator, 118: insulator, 120: insulator, 122: insulator, 124: insulator, 126: insulator, 130: conductor, 132: conductor, 132*a*: conductor, 132*b*: conductor, 132*c*: conductor, 132*d*: conductor, 132*e*: conductor, 133: region, 134: conductor, 134*a*: conductor, 134*b*: conductor, 134*c*: conductor, 134*d*: conductor, 134*e*: conductor, 136*a*: conductor, 136*b*: conductor, 136*c*: conductor, 136*d*: conductor, 136*e*: conductor, 138: conductor, 138*a*: conductor, 138*b*: conductor, 140: capacitor, 140*a*: capacitor, 141: resistor, 142: AC power source, 144: capacitor, 200: transistor, 200A: transistor, 200B: transistor, 203: conductor, 203*a*: conductor, 203*b*: conductor, 204: insulator, 213: insulator, 230: metal oxide, 230*a*: metal oxide, 230*b*: metal oxide, 245: insulator, 252: insulator, 711: substrate, 712: circuit region, 713: separation region, 714: separation line, 715: chip, 750: electronic component, 752: printed circuit board, 753: communication device, 754: circuit board, 755: lead, 801: cloud field, 802: embedded field, 804: power consumption, 805: processing performance, 831: master device, 832: M2M interface, 841: IoT end device, 842: industrial robot, 881: home, 882: office, 883: cloud, 884: factory, 885: factory, 886: factory, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: communication device, 8005: power storage device, 8100: lighting device, 8101: housing, 8102: light source, 8103: communication device, 8104: ceiling, 8105: power storage device, 8200: indoor unit, 8201: housing, 8202: air outlet, 8203: communication device, 8204: outdoor unit, 8205: power storage device, 8300: electric refrigerator-freezer, 8301: housing, 8302: refrigerator door, 8303: freezer door, 8304: communication device, 8305: power storage device, 8405: wall, 8406: floor, 8407: window

The invention claimed is:

1. A communication device comprising a duplexer, the duplexer comprising:
a first insulator over a substrate;
a first conductor over the first insulator;
a second insulator over the first conductor;
a first transistor, a second transistor, a third transistor, and a fourth transistor over the second insulator; and
a transmission terminal, a reception terminal, an antenna terminal, a first control terminal, and a second control terminal,
wherein one of a source and a drain of the first transistor comprises a second conductor,
wherein the other of the source and the drain of the first transistor comprises a third conductor,
wherein a gate of the first transistor comprises a fourth conductor,
wherein a channel formation region of the first transistor comprises a first semiconductor,
wherein one of a source and a drain of the second transistor comprises the third conductor,
wherein the other of the source and the drain of the second transistor comprises a fifth conductor,
wherein a gate of the second transistor comprises a sixth conductor,
wherein a channel formation region of the second transistor comprises a second semiconductor,
wherein one of a source and a drain of the third transistor comprises the fifth conductor,
wherein the other of the source and the drain of the third transistor comprises a seventh conductor,
wherein a gate of the third transistor comprises an eighth conductor,
wherein a channel formation region of the third transistor comprises a third semiconductor,
wherein one of a source and a drain of the fourth transistor comprises the seventh conductor,
wherein the other of a source and a drain of the fourth transistor comprises a ninth conductor,
wherein the gate of the fourth transistor comprises a tenth conductor,
wherein a channel formation region of the fourth transistor comprises a fourth semiconductor,
wherein the first conductor comprises a region which overlaps with the third conductor, the fifth conductor, and the seventh conductor,
wherein the transmission terminal is electrically connected to the third conductor,
wherein the reception terminal is electrically connected to the seventh conductor,
wherein the antenna terminal is electrically connected to the fifth conductor,
wherein the first control terminal is electrically connected to the fourth conductor and the eighth conductor,
wherein the second control terminal is electrically connected to the sixth conductor and the tenth conductor, and
wherein each of the first semiconductor, the second semiconductor, the third semiconductor, and the fourth semiconductor comprises an oxide semiconductor.

2. The communication device according to claim 1,
wherein a potential of the other of the source and the drain of each of the first and third transistors is a reference potential,
wherein when the second and third transistors are on, potentials of the gates of the second and third transistors are set to a first potential,
wherein when the second and third transistors are off, the potentials of the gates of the second and third transistors are set to a second potential,
wherein a difference between the first potential and the reference potential is more than or equal to 2 V, and
wherein the second potential is lower than the reference potential.

3. The communication device according to claim 2,
wherein when a first signal is transmitted from the transmission terminal to the antenna terminal, the potentials of the gates of the second and third transistors are set to the first potential and potentials of the gates of the first and fourth transistors are set to the second potential, and
wherein when a second signal is transmitted from the antenna terminal to the reception terminal, the potentials of the gates of the second and third transistors are set to the second potential and the potentials of the gates of the first and fourth transistors are set to the first potential.

4. The communication device according to claim 2,
wherein the second potential is a negative potential.

5. The communication device according to claim 1, wherein the oxide semiconductor comprises In and Zn.

6. The communication device according to claim 1,
wherein each of the first to fourth transistors comprises a back gate.

* * * * *